United States Patent
Miyajima et al.

(10) Patent No.: US 7,447,248 B2
(45) Date of Patent: Nov. 4, 2008

(54) SEMICONDUCTOR LASER ELEMENT AND SEMICONDUCTOR LASER ELEMENT ARRAY

(75) Inventors: Hirofumi Miyajima, Hamamatsu (JP); Akiyoshi Watanabe, Hamamatsu (JP); Hirofumi Kan, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 10/591,229

(22) PCT Filed: Mar. 4, 2005

(86) PCT No.: PCT/JP2005/003751
§ 371 (c)(1),
(2), (4) Date: May 21, 2007

(87) PCT Pub. No.: WO2005/086303
PCT Pub. Date: Sep. 15, 2005

(65) Prior Publication Data
US 2007/0258496 A1    Nov. 8, 2007

(30) Foreign Application Priority Data
Mar. 4, 2004  (JP) ............................. 2004-061216
Jul. 8, 2004  (JP) ............................. 2004-202405

(51) Int. Cl.
*H01S 5/00* (2006.01)
*H01S 3/08* (2006.01)
(52) U.S. Cl. .............. 372/45.01; 372/43.01; 372/50.12; 372/92
(58) Field of Classification Search .............. 372/43.01, 372/45.01, 50.12, 92, 98
See application file for complete search history.

(56) References Cited

U.S. PATENT DOCUMENTS
4,958,355 A * 9/1990 Alphonse et al. ......... 372/45.01
(Continued)

FOREIGN PATENT DOCUMENTS
JP    5-167197    7/1993
(Continued)

OTHER PUBLICATIONS

Dr. Konstantin Boucke. "In Search of the Ultimate Diode Laser," *Photonics Spectra*, Sep. 2001, p. 122-126.

*Primary Examiner*—Minsun Harvey
*Assistant Examiner*—Phillip Nguyen
(74) *Attorney, Agent, or Firm*—Drinker Biddle & Reath LLP

(57) ABSTRACT

The present invention relates to a semiconductor laser element and the like which can efficiently emit laser beams at a small emission angle using a simpler configuration. The semiconductor laser element has a structure where an n-type cladding layer, active layer and p-type cladding layer are sequentially laminated. The p-type cladding layer has a ridge portion for forming a refractive index type waveguide in the active layer. The ridge portion, at least the portion excluding the edges, extends in a direction crossing each normal line of both end faces of the refractive index type waveguide, which corresponds to the light emitting face and light reflecting face respectively, at an angle θ, which is equal to or less than the complementary angle θc of the total reflection critical angle on the side face of the refractive index type waveguide. The optical paths of light components which resonate in the refractive index type waveguide formed by the ridge portion having the above form are limited to optical paths where the lights are totally reflected on the side face of the refractive index type waveguide. In other words, the laser beams emitted from the light emitting end have a spatial horizontal single mode, and the waveguide width can be increased to further decrease the emission angle of the laser beams.

12 Claims, 23 Drawing Sheets

U.S. PATENT DOCUMENTS

| | | | |
|---|---|---|---|
| 5,008,889 A * | 4/1991 | Wilson | 372/32 |
| 5,223,722 A * | 6/1993 | Nagai et al. | 257/96 |
| 6,804,281 B1 * | 10/2004 | Walpole et al. | 372/45.01 |
| 2004/0065890 A1 * | 4/2004 | Alphonse et al. | 257/94 |
| 2005/0030995 A1 * | 2/2005 | Kawakami et al. | 372/43 |

FOREIGN PATENT DOCUMENTS

| | | |
|---|---|---|
| JP | 10-41582 | 2/1998 |
| JP | 10-284805 | 10/1998 |
| WO | 00/48277 | 8/2000 |

\* cited by examiner

Fig.5
(a)
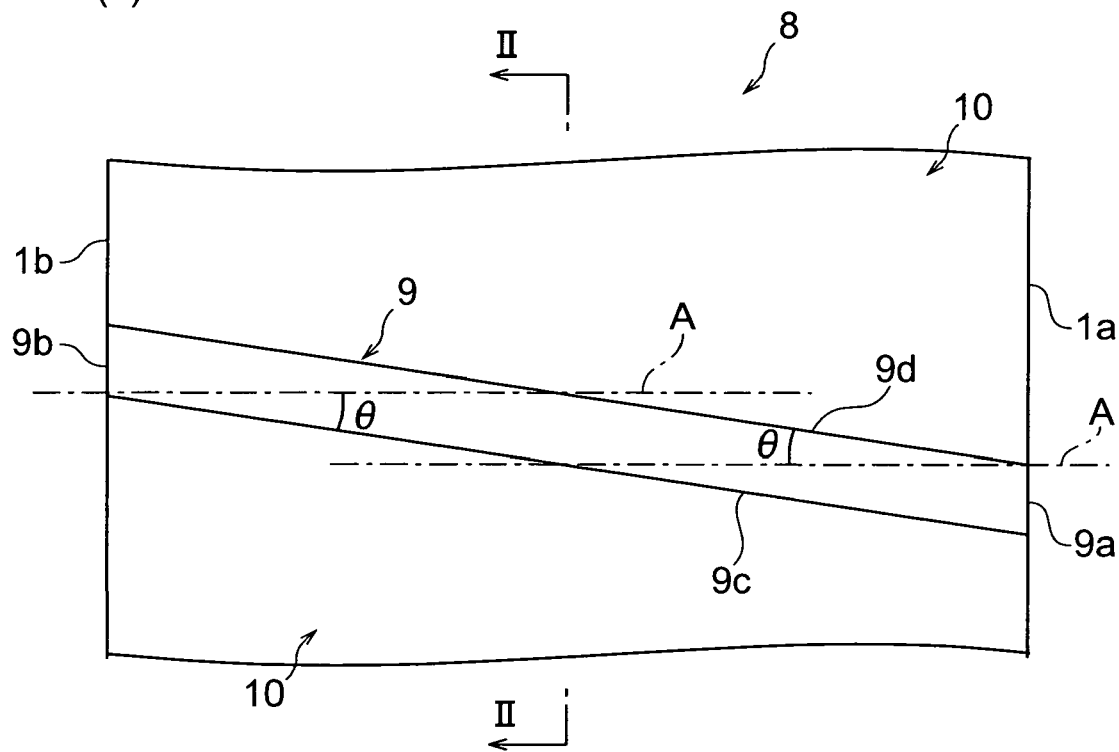
(b)
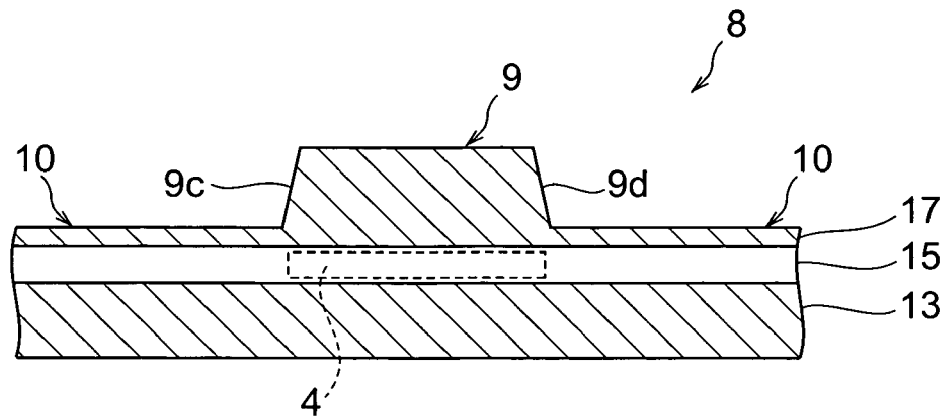

Fig. 10
(a)
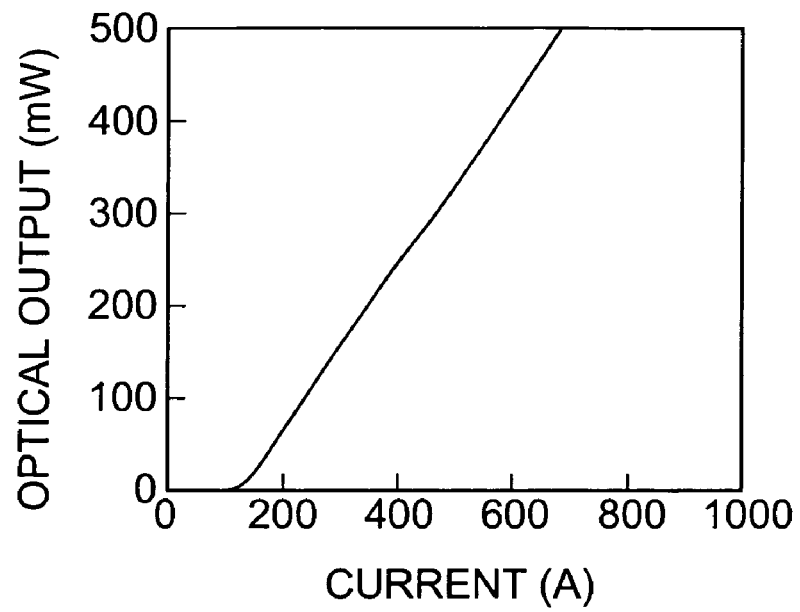
(b)
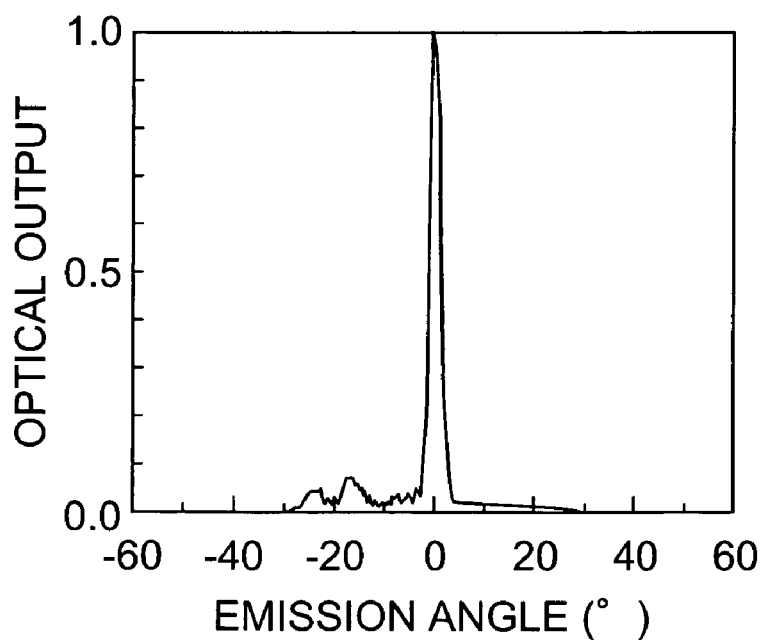

*Fig.11*
(a)
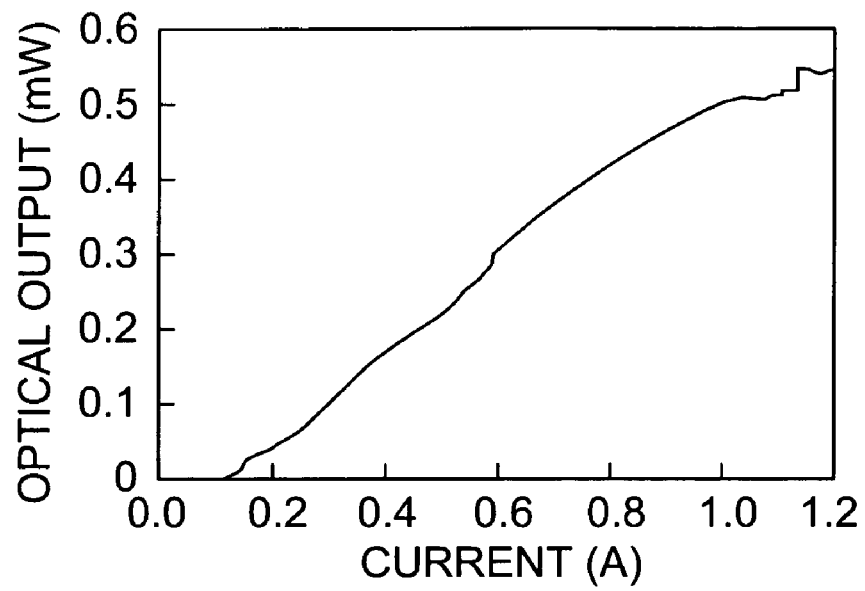
(b)
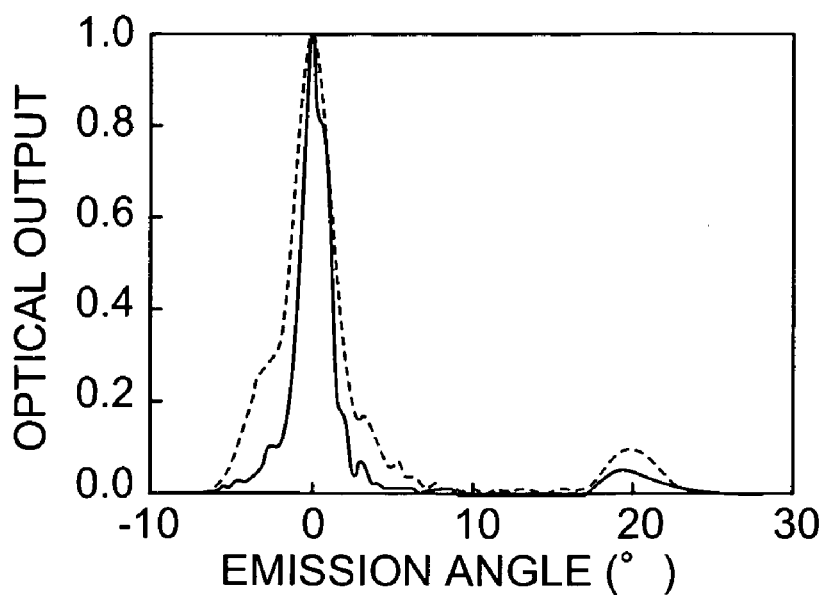

Fig.12
(a)
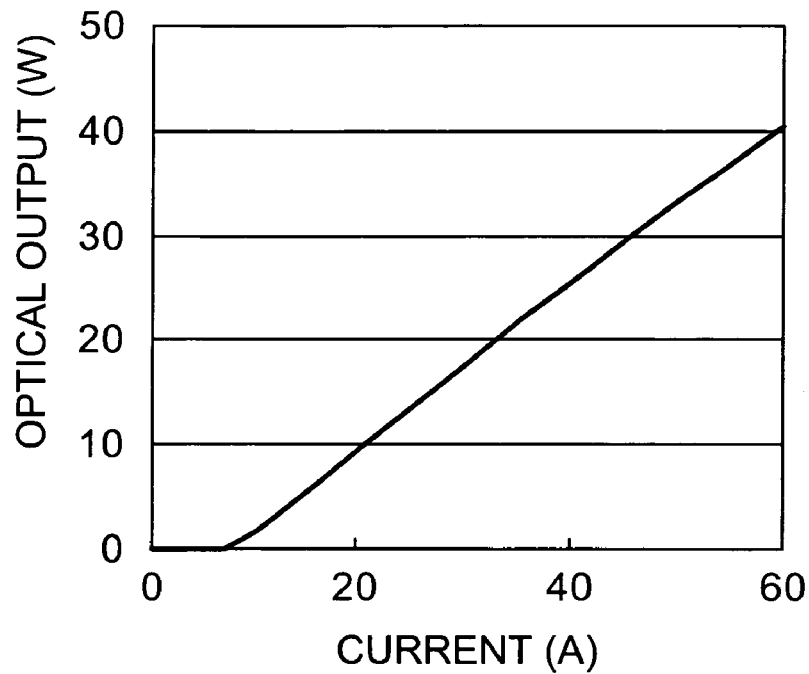
(b)
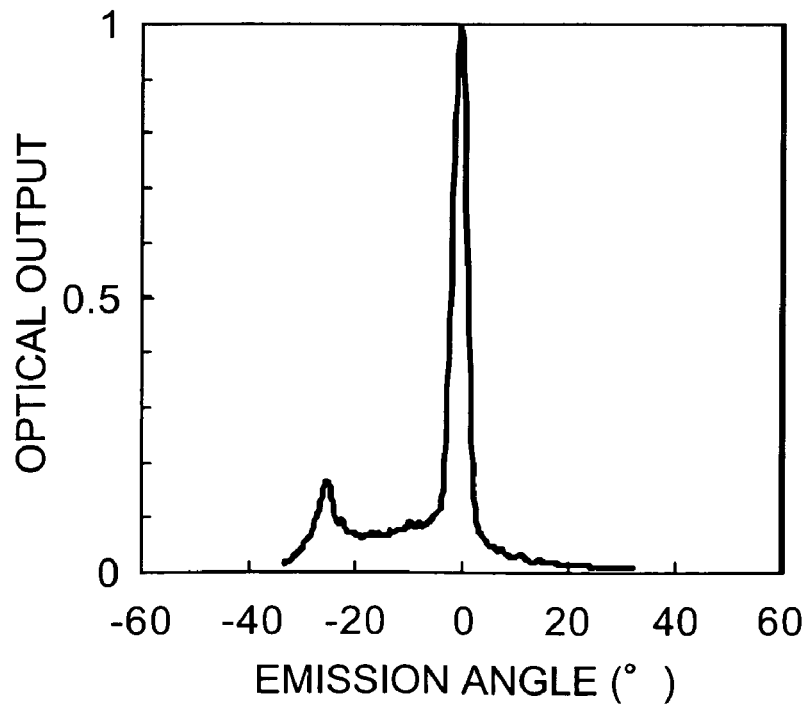

Fig.19
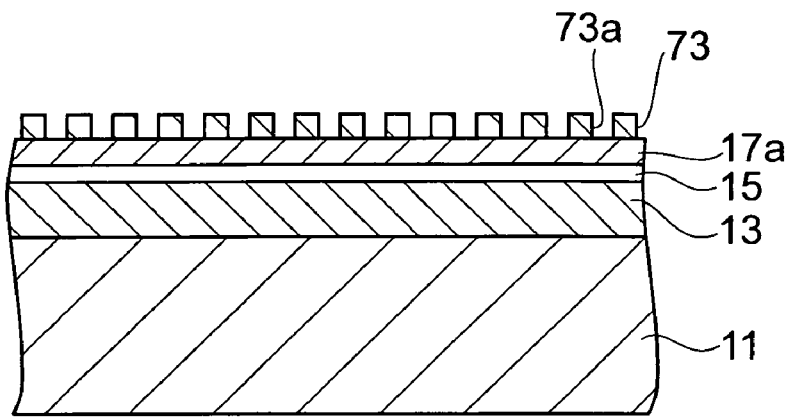
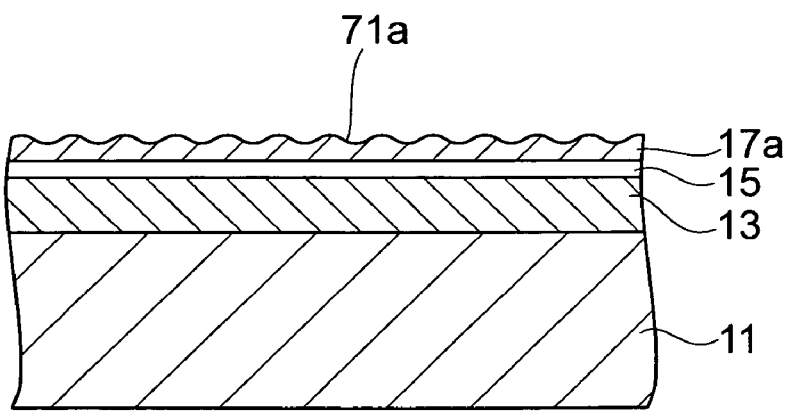
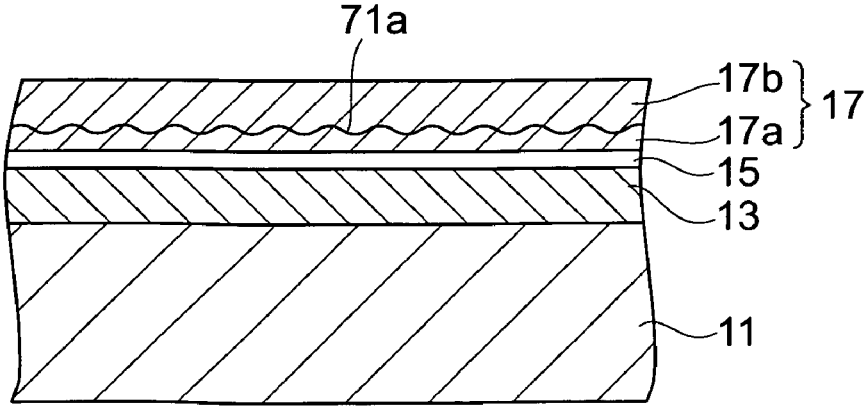

Fig.20
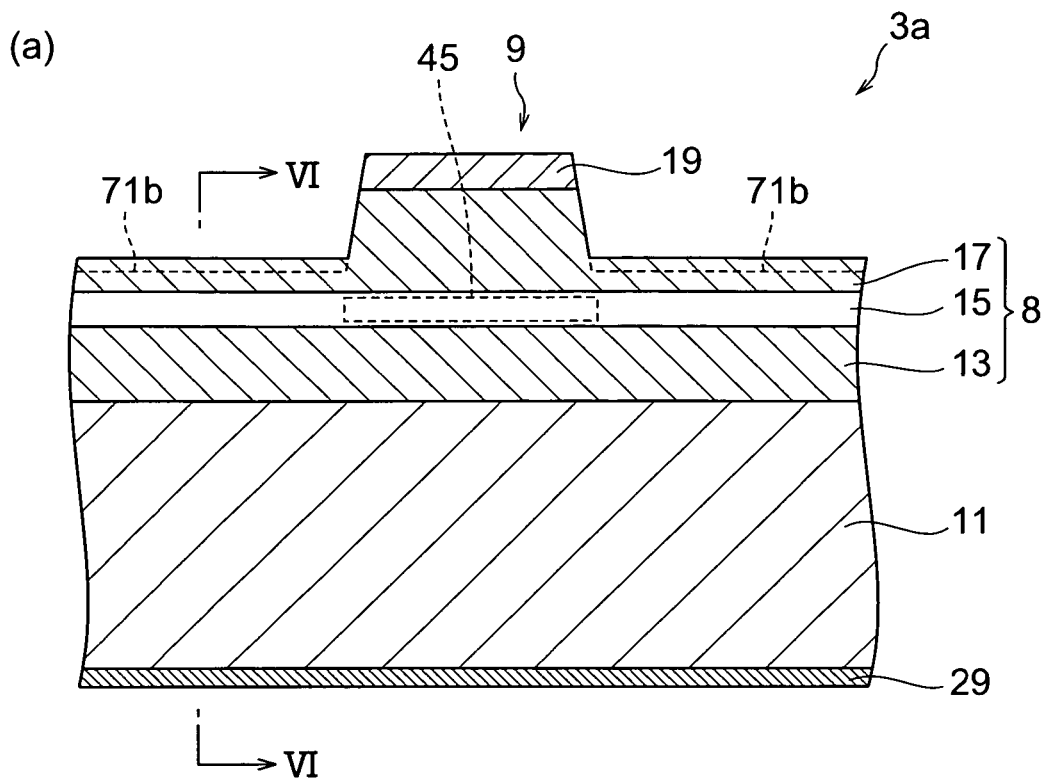
(a)
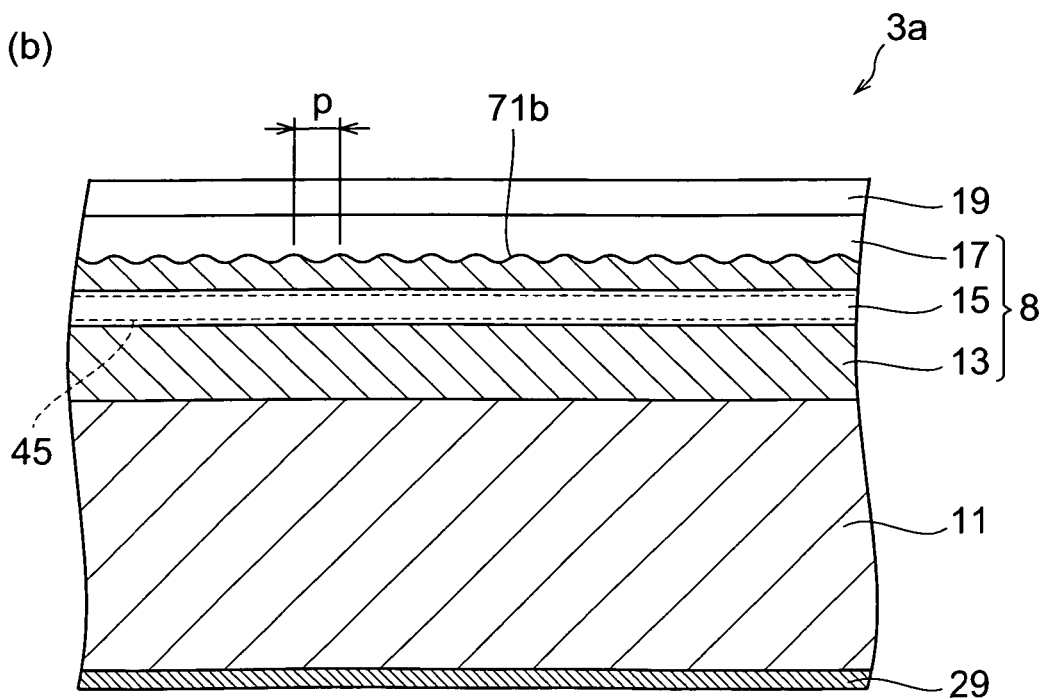
(b)

Fig.21
(a)
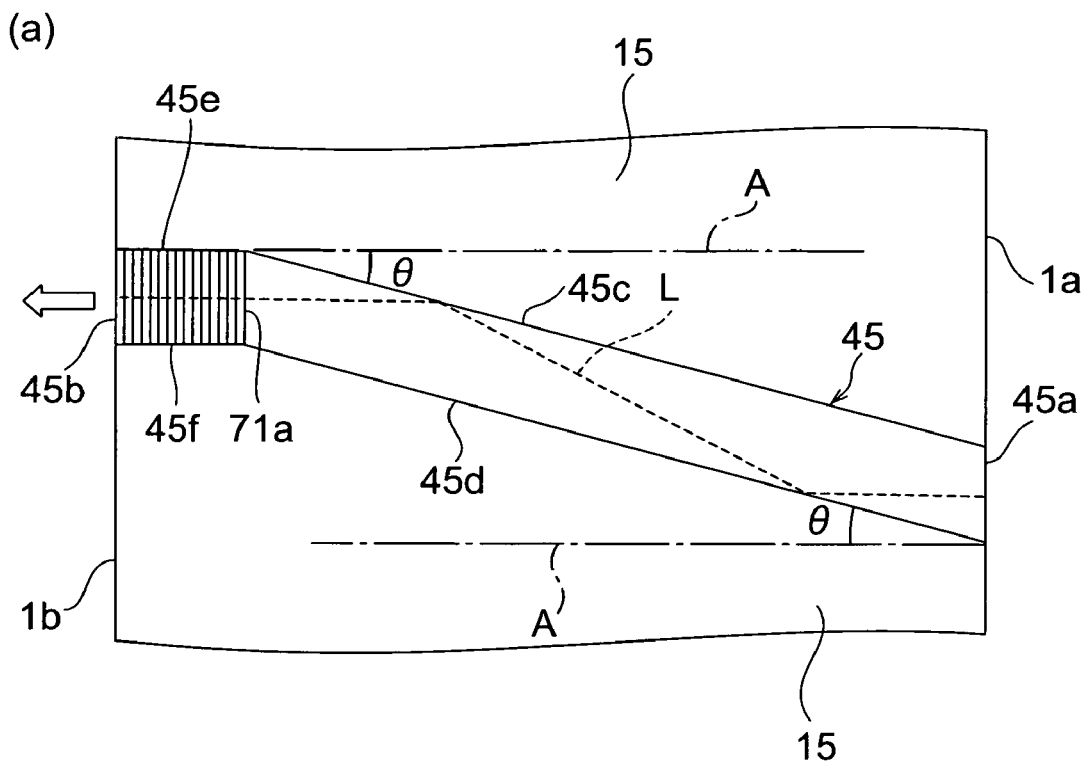
(b)
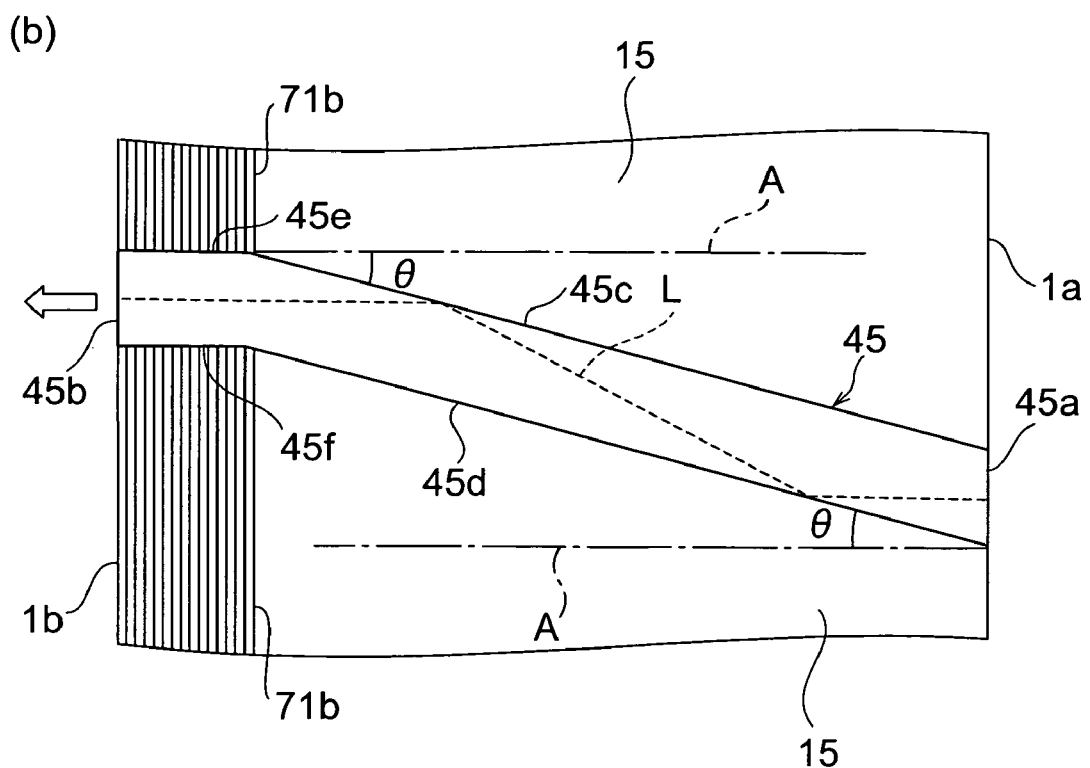

SEMICONDUCTOR LASER ELEMENT AND SEMICONDUCTOR LASER ELEMENT ARRAY

TECHNICAL FIELD

The present invention relates to a semiconductor laser element, and a semiconductor laser element array which includes the semiconductor laser elements.

BACKGROUND ART

As a semiconductor laser element, a spatial horizontal single mode type one and a multi-mode type one are always known. In a single mode type semiconductor laser element, a waveguide with a narrow width is formed to limit the oscillation mode in the waveguide to only a single mode. However, when the width of the waveguide is narrow, the area of the emitting end also becomes small. When the laser beam density becomes excessively high at the emitting end, reliability of the semiconductor laser element is influenced. Therefore, the single mode type semiconductor laser element is suitable for applications where relatively low output laser beams are used. An example of the single mode type semiconductor laser element is the semiconductor laser device disclosed in Patent Document 1. This semiconductor laser device is a single mode type semiconductor laser, of which object is increasing the laser beam intensity by expanding the width of the waveguide.

In the multi-mode type semiconductor laser element, on the other hand, a plurality of modes may coexist in the waveguide, so a wide waveguide can be formed. Therefore, the area of the emitting end can be large, and relatively high intensity laser beams can be emitted. This multi-mode type semiconductor laser element is suitable for applications where relatively high output laser beams are required.

The multi-mode type semiconductor laser element, however, has the following problem. A plurality of modes coexist in the waveguide, so the emission pattern of the laser beams to be emitted from the emitting end is disturbed, and the emission angle becomes relatively large. So the shape of the lens to condense or collimate the laser beams becomes complicated, and desired laser beams may not be acquired or the manufacturing cost may become high (lens becomes expensive).

An example of a technology to solve this problem of a multi-mode type semiconductor laser element is the resonator disclosed in the Patent Document 2. FIG. 1 shows the structure of a conventional resonator, and the area (a) is a plan view showing the configuration of this resonator. The resonator 100 has two regions 102a and 102b in the active layer 101. In the area (b) of FIG. 1, the refractive index distribution in the VII-VII cross section in the area (a) and the VIII-VIII cross section in the area (a) are shown. As shown in the area (b), the refractive index n2 in the regions 102 a and 102 b is lower than refractive index nil in the other area of the active layer 101. The regions 102a and 102 b are formed in the active layer 101 at an angle at which the lights L, vertically reflected at the emitting end 100 a and the reflecting end 100 b, are totally reflected on the side faces of these regions 102 a and 102 b. In Patent Document 2, a single mode oscillation is attempted to be implemented without limiting the waveguide width by limiting the optical paths of the lights L resonating in the active layer 101 using this configuration. Patent Document 1: Japanese Patent Application Laid-Open No. Hei10-41582Patent Document 2: International Publication No. 00/48277 Pamphlet

DISCLOSURE OF THE INVENTION

Problems that the Invention is to Solve

The present inventors have examined conventional semiconductor laser, and as a result, have discovered the following problems. That is, in the case of the configuration of the resonator disclosed in Patent Document 2, the areas 102 a and 102 bare formed by forming a groove in the active layer 101. Therefore, the groove for the areas 102 a and 102 b and the current injection area must be formed simultaneously in the active layer 101, which makes the stricture complicated and requires many fabrication steps. Also, the current injected into the active layer 101 easily leaks outside the waveguide in this configuration, so the emission efficiency and the photoelectric conversion efficiency are suppressed low. Low emission efficiency and photoelectric conversion efficiency lead to the rise of temperature of the element, so reliability of the element may be diminished or laser beam intensity may not be sufficiently increased.

The present invention has been developed to eliminate the problems described above. It is an object of the present invention to provide a semiconductor laser which can efficiently emit relatively high intensity laser beams with a small emission angle using a simpler configuration, and a semiconductor laser element array which includes a plurality of semiconductor laser elements.

Means for Solving The Problems

To solve the above problems, the semiconductor laser element according to the present invention has a first cladding layer with a first conductive type, a second cladding layer with a second conductive type different from the first conductive type which is provided on the first cladding layer, and an active layer provided between the first and second cladding layers. The semiconductor laser element also has a light emitting face which corresponds to one end face of the active layer, and a light reflecting face which corresponds to the other end face facing one end face of the active layer. These light emitting face and light reflecting face are arranged such that a first normal line and a second normal line, which pass through the respective center, are substantially in parallel. For the light emitting face and light reflecting face, a part of the cleavage plane of the active layer, which functions as a resonance face for the laser beams, can be used, and the positional relationship of the normal lines of the cleavage planes which face each other like this is substantially in parallel status. For example, the light emitting face and the light reflecting face may be placed in a status where the first normal line and the second normal line are matched (both normal lines are on one straight line), or the first normal line and second normal line may be placed with a predetermined distance apart. In either case, the placement status depends on the shape of the ridge portion. The second cladding layer has a ridge portion for forming a refractive index type waveguide of which both end faces correspond to the light emitting face and the light reflecting face respectively. This ridge portion has a shape where at least a portion, excluding both ends thereof, extends in a direction crossing the first and second normal lines at an angle equal to or less than the complementary angle θc of the total reflection critical angle on the side face of the refractive index type waveguide respectively. The total reflection critical angle is a minimum angle at which incoming beams are totally reflected on the side face, out of the angles (incident angles) formed by the normal line of the side face of the refractive index type waveguide and the incoming direction of the beams which reach this side face, and the complementary angle θc thereof is given by (90° — total reflection critical angle). In this description, the complementary angle of the total reflection critical angle is simply called the "critical complementary angle".

In the semiconductor laser element having the above structure, a part of the active layer positioned directly under the ridge portion becomes an active area by the current being injected into the ridge portion of the second cladding layer. At this time, an effective refractive index difference is generated in the active layer because of the refractive index difference between the ridge portion and the area outside thereof, so the refractive index type waveguide having a shape along the two-dimensional shape of the ridge portion (shape of the ridge portion viewed from the thickness direction of the second cladding layer) is formed. Also, at this time, at lest the portion of the ridge portion excluding both ends has a shape extending in a direction crossing the first and second normal lines (normal line which passes through the center of the light emitting face and normal line which passes through the center of the light reflecting face) at an angle equal to or less than the critical complementary angle θc on the side face of the refractive index type waveguide, so the refractive index type waveguide having a shape corresponding to the shape of the ridge portion is formed in the active layer. At this time, the light reflected on the light reflecting face along the normal line (first normal line) of the light reflecting face reach the light emitting face while repeating total reflection between a pair of side faces of the refractive index type waveguide. On the other hand, the lights reflected on the light emitting face along the normal line (second normal line) of the light emitting face also reach the light reflecting face via a similar optical path. Lights along a direction different from the predetermined axis direction for the first and second normal line respectively transmit the side face of the refractive index type waveguide.

As described above, in accordance with the semiconductor laser element of the present invention, the resonance optical path can be limited because of the structure of the refractive index type waveguide, so the angle of the light components related to the laser oscillation in the waveguide is limited. As a result, the phases of the guided lights are aligned and single mode oscillation is generated, and the emission angle of the laser beams emitted in a horizontal direction decreases as the waveguide width increases. Also, unlike the single mode type semiconductor laser element, the width of the refractive index type waveguide is not limited, so laser beams with higher intensity can be emitted.

In the semiconductor laser element of the present invention, a local and concentrated current is injected into the active layer by the ridge portion of the second cladding layer which can be formed easily, and the injected current does not leak outside the refractive index type waveguide very much. As a result, in accordance with the semiconductor laser element of the present invention, emission efficiency and photoelectric conversion efficiency dramatically improve compared with the conventional semiconductor laser element. Also, by this, a temperature increase of the element is effectively suppressed, so reliability of the element improves and laser beams with higher intensity can be acquired.

In the semiconductor laser element according to the present invention, it is preferable that the distance between the light emitting face and the light reflecting face, and the maximum width of the ridge portion along the direction perpendicular to the first and second normal lines are set such that the light components which resonate between the light emitting face and the light reflecting face are reflected for a same number of times respectively on a pair of side faces facing each other of the refractive index type waveguide. In this case, the resonating light components are reflected (total reflection) on each of the pair of side faces of the refractive index type waveguide for a same number of times, so the resonating light components are appropriately entered/reflected along the first and second normal lines in both the light reflecting face and light emitting face. Also, the resonating light components are totally reflected at least once on each of the pair of side faces of the refractive index type waveguide, so an optical path directly connecting the light emitting face and the light reflecting face does not exit in the refractive index type waveguide. As a consequence, in accordance with the semiconductor laser element of the present invention, the resonance optical path in the refractive index type waveguide can be appropriately limited.

In the semiconductor laser element according to the present invention, at least one of the edge of the light emitting face side and the edge of the light reflecting face side of the ridge portion extends along the first and second normal lines respectively. In this case, on each of the light emitting face and the light reflecting face, emission of the laser beams in a direction different from the first and second normal lines is effectively suppressed.

In the semiconductor laser element according to the present invention, it is preferable that an angle θ formed by a direction in which the ridge portion, at least a portion, excluding both edges, extends and each normal line of the light emitting face and the light reflecting face is within the following range.

$$\theta c - 1° \leq \theta \leq \theta c$$

By the angle θ being set in the above range, the resonance optical path in the refractive index type waveguide is appropriately limited. As a result, higher horizontal mode is effectively suppressed.

In the semiconductor laser element according to the present invention, the above angle θ may substantially match the critical complementary angle θc. In this case, higher horizontal mode is almost completely suppressed.

The semiconductor laser element according to the present invention may further comprises a wavelength selection means for selecting a wavelength of light components which resonate in the refractive index type waveguide. The critical complementary angle on the side face of the refractive index type waveguide depends on the wavelength of the light components reflected on the side face. In accordance with this semiconductor laser element, the wavelength of the light components which resonate in the refractive index type waveguide is selected by the wavelength selection means, so the dispersion of the critical complementary angle on the side face of the refractive index type waveguide can be eliminated or decreased, and the optical path of the laser beams can be efficiently limited.

This wavelength selection means can be implemented by a periodic diffraction grating formed along at least a part of the refractive index type waveguide formed inside the active layer. The wavelength selection means can also be implemented by a dielectric multilayer film formed on at least one face of the light emitting face and light reflecting face. The wavelength selection means can also be implemented by a wavelength selecting element placed so as to face at least one face of the light emitting face and the light reflecting face. The wavelength selection means can also be implemented by a combination of two or more of the diffraction grating, dielectric multilayer film and wavelength selecting element.

A semiconductor laser element array comprises a plurality of semiconductor laser elements, each of which has the above mentioned structure. These plurality of semiconductor laser elements are integratedly formed in a status of being arrayed in a direction perpendicular to each normal line of the light emitting face and the light reflecting face.

As described above, in accordance with the semiconductor laser element array where a plurality of semiconductor laser elements are integratedly formed, semiconductor laser elements having the same structure as the semiconductor laser element according to the present invention are used, so laser beams having relatively high intensity can be emitted, the emission angle of the laser beams in the horizontal direction can be small, and high emission efficiency and photoelectric conversion efficiency can be implemented with a simpler structure.

Also, in the semiconductor laser element array according to the present invention, a local and concentrated current can be injected into the active layer by the ridge portion of the second cladding layer. Therefore, the coupling and interference of lights hardly occurs between adjacent refractive index type waveguides. As a result, space between the refractive index type waveguides can be relatively small. This makes it possible to form more refractive index type waveguides at high density, and emit high output laser beams stably.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

Effects of the Invention

In accordance with the present invention, a semiconductor laser element and semiconductor laser element array, which can efficiently emit relatively high intensity laser beams with a small emission angle, and having a single peak horizontal emission pattern, can be provided using a simpler configuration.

BRIEF DESCRIPTION OF THE DRAWINGS

FIG. 5 is a view showing the structure of the laminated body shown in FIG. 4;

FIG. 10 shows graphs of the current vs. optical output characteristics of the semiconductor laser element according to the first embodiment, and the horizontal far-field pattern of the laser beams emitted from the light emitting end of the semiconductor laser element;

FIG. 11 shows graphs of the current vs. optical output characteristics of the conventional resonator, and the horizontal far-field pattern of the laser beams emitted from the conventional resonator, as a comparative example;

FIG. 12 shows graphs of the current—optical output characteristics of the semiconductor laser element array shown in FIG. 2, and the horizontal far-field pattern of the laser beams emitted from the light emitting end of each semiconductor laser element of the semiconductor laser element array (semiconductor laser element according to the first embodiment);

FIG. 19 is a view explaining the fabrication steps of the diffraction grating as the wavelength selection means;

FIG. 20 shows the cross-sectional structure (a part of V—V cross-section and a part of VI—VI cross-section) of the semiconductor laser element according to the sixth embodiment shown in FIG. 17;

FIG. 21 shows plan views of the configuration around the refractive index type waveguide formed in the active layer as a variant form of the semiconductor laser element according to the sixth embodiment shown in FIG. 17;

DESCRIPTION OF THE REFERENCE NUMERALS

1 . . . semiconductor laser element array; 1a . . . light emitting face; 1b . . . light reflecting face; 3 . . . semiconductor laser element; 4, 41-44 . . . refractive index type waveguide; 4a, 41a-44a . . . laser beam emitting end; 4b, 41b-44b . . . laser beam reflecting end; 4c, 4d, 41c-41f, 42c-42j, 43c, 43d, 44c-44f . . . side face; 8 . . . laminated body; 9 . . . ridge portion; 9a . . . first end face; 9b . . . second end face; 9c, 9d . . . side face; 10 . . . thin region; 11 . . . substrate; 13 . . . n-type cladding layer; 15 . . . active layer; 17 . . . p-type cladding layer; 19 . . . cap layer; 21 . . . insulating layer; 21a . . . opening; 23 . . . p-side electrode layer; 25 . . . convex portion; 29 . . . n-side electrode layer; and 51 . . . passivation mask.

BEST MODES FOR CARRYING OUT THE INVENTION

In the following, embodiments of the semiconductor laser element and semiconductor laser element array according to the present invention will now be explained with reference to FIGS. 2 to 23. In the description of the drawings, the same composing elements are denoted with the same reference symbols, and redundant description thereof will be omitted.

First Embodiment

Figure 1:
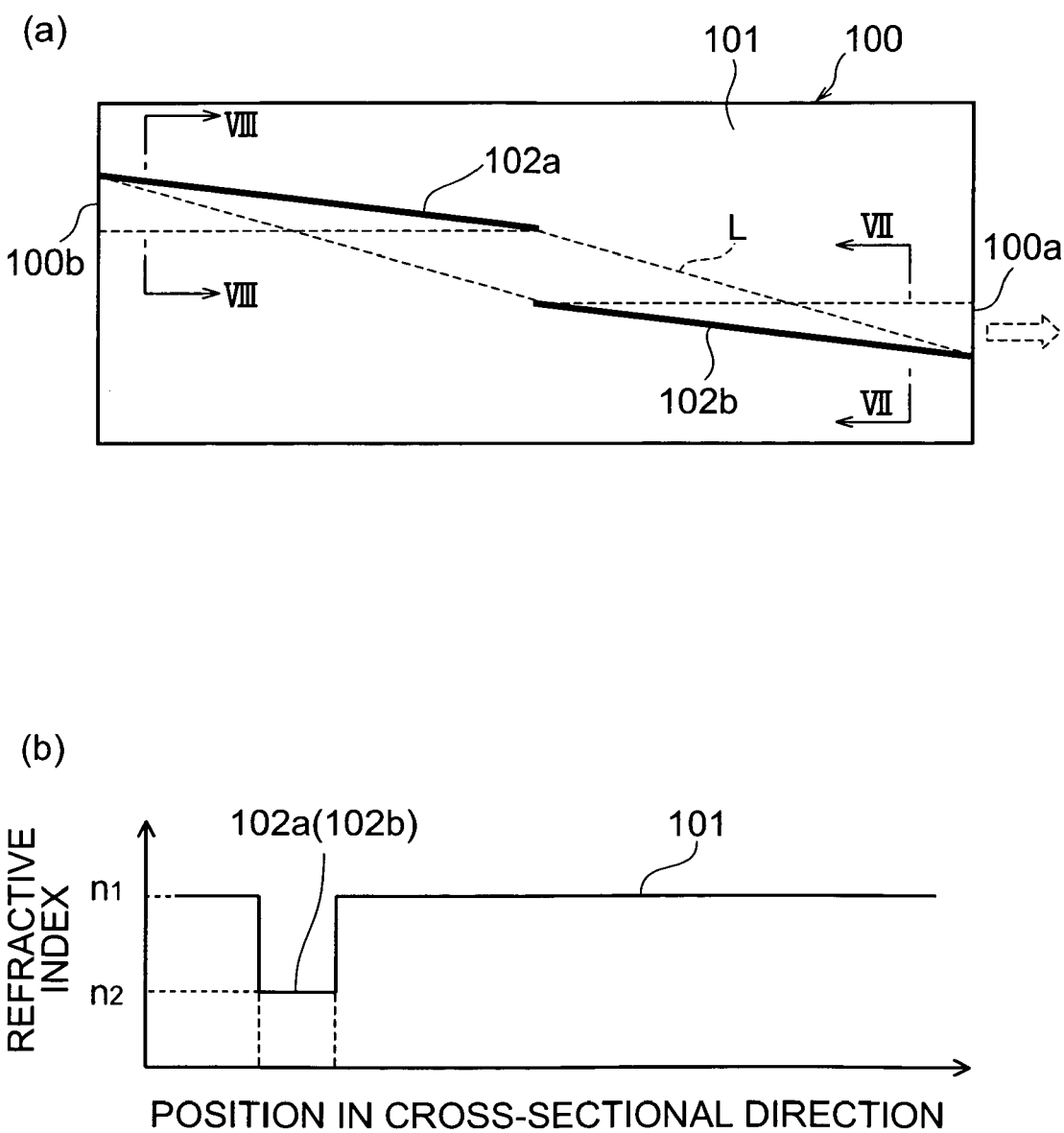
FIG. 1 is a view showing the structure of a conventional resonator.
Figure 2:
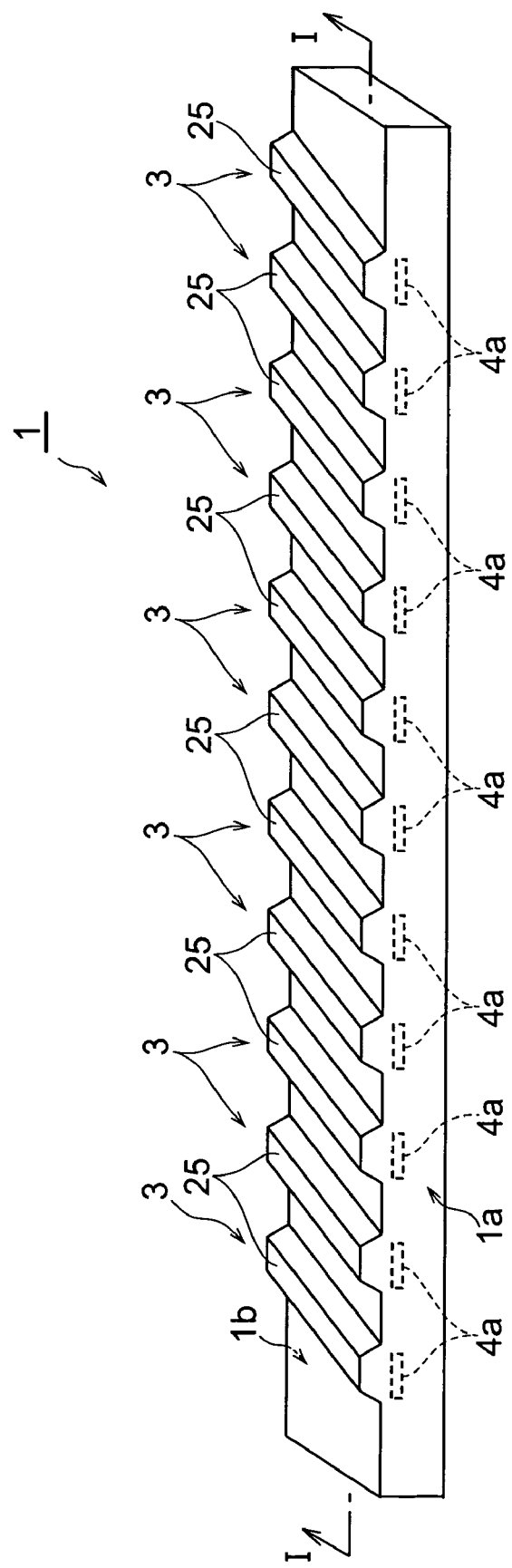
FIG. 2 is a perspective view showing the configuration of a semiconductor laser element array to which a first embodiment of a semiconductor laser element according to the present invention is applied (an embodiment of a semiconductor laser element array according to the present invention)

FIG. 2 is a perspective view showing the configuration of the semiconductor laser element array to which the first embodiment of the semiconductor laser element according to the present invention is applied (an embodiment of the semiconductor laser element array according to the present invention). As shown in FIG. 2, the semiconductor laser element array 1 has a plurality of semiconductor laser elements 3 which have an integral structure. The number of semiconductor laser elements 3 of the semiconductor laser element array 1 can be arbitrary, and when there is only one, it is not an array but a single semiconductor laser element. The semiconductor laser element array 1 has a light emitting face 1a and light reflecting face 1b, which face each other, and on the light emitting face 1a, a laser beam emitting end 4a of each semiconductor laser element 3 is placed in the horizontal direction. Each of the plurality of semiconductor laser elements 3 has a convex portion 25 which is formed in a ridge shape. The convex portion 25 is formed such that the longitudinal direction thereof becomes diagonal with respect to the light emitting face 1a and light reflecting face 1b, and in each semiconductor laser element 3, the refractive index type waveguide (described later) is formed corresponding to the convex portion 25. The laser beam emitting end 4a is an end face of the refractive index type waveguide at the light emitting face 1a side. The plurality of semiconductor laser elements 3 formed in an integral structure are placed along the direction crossing the longitudinal direction of the convex portion 25.

Figure 3:
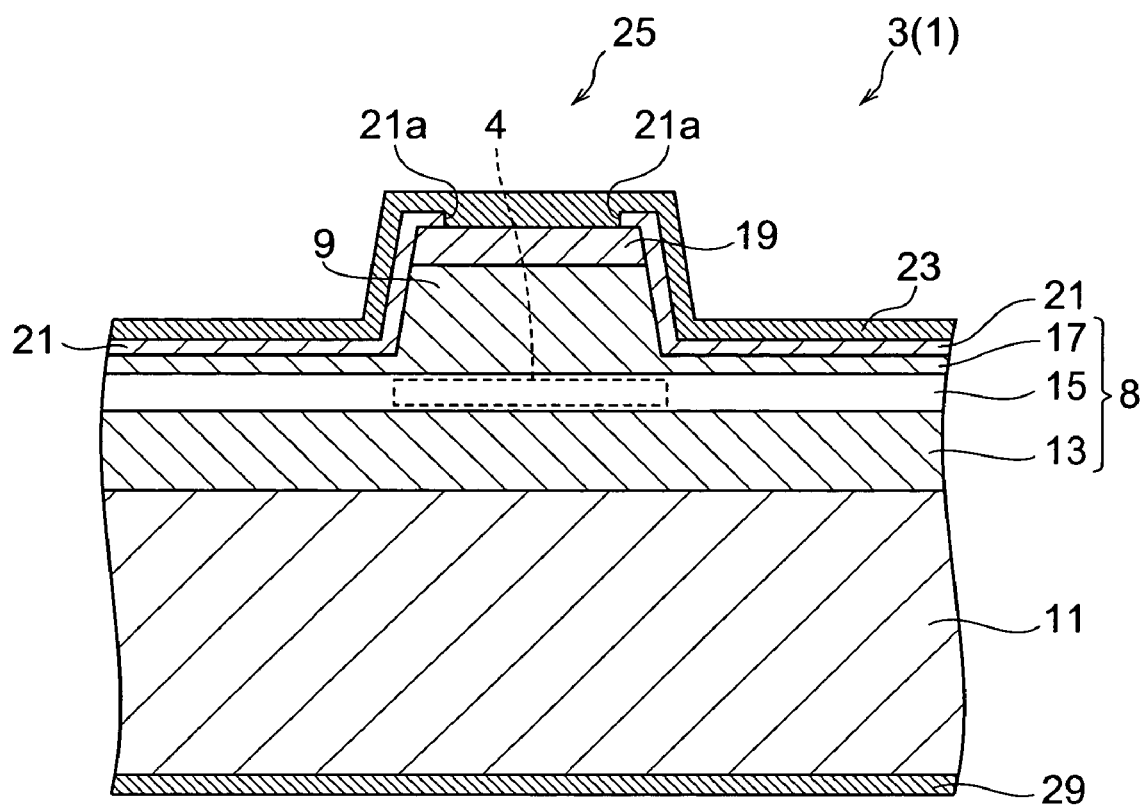
FIG. 3 is an enlarged cross-sectional view showing the I—I cross-section of the semiconductor laser element array shown in FIG. 1.

FIG. 3 is an enlarged cross-sectional view showing the I—I cross-section of the semiconductor element array 1 shown in FIG. 2. As shown in FIG. 3, the semiconductor laser element 3 constituting a part of the semiconductor laser element array 1 has a substrate 11 and a laminated body 8 where three semiconductor layers are stacked. In the laminated body 8, three semiconductor layers of an n-type cladding layer (cladding layer with a second conductive type) 13, an active layer 15 and a p-type cladding layer (cladding layer with a first conductive type) 17 are sequentially laminated. In the p-type cladding layer 17, the ridge portion 9 is formed. On the ridge portion 9, a cap layer 19, which is electrically connected with the p-type cladding layer 17, is formed, and the ridge portion 9 and the cap layer 19 constitute the convex portion 25.

On the cap layer 19, a p-side electrode layer 23, for injecting current from the outside, is formed. Between the p-type cladding layer 17 and the p-side electrode 23, and between the cap layer 19 and the p-side electrode layer 23, an insulation layer 21 is formed, and the insulation layer 21 has an opening 21a on the convex portion 25. The p-side electrode layer 23 electrically contacts only to the cap layer 19 via the opening 21a, so current is injected from the outside only to the cap layer 19. On the face of the substrate 11 existing at the opposite side of the face where the laminated body 8 is formed, an n-side electrode layer 29 is formed. The substrate 11 is made of n-GaAs. The n-type cladding layer 13 is made of n-AlGaAs, the active layer 15 is made of GaInAs/AlGaAs, and the p-type cladding layer 17 is made of p-AlGaAs. The cap layer 19 is made of p-GaAs, the p-side electrode layer 23 is made of Ti/Pt/Au, the n-side electrode layer 29 is made of AuGe/Au, and the insulation layer 21 is made of SiN.

When current is injected into the cap layer 19, the area of the active layer 15 existing directly under the convex portion 25 (in other words, the area corresponding to the ridge portion 9) becomes an active area. At this time, an effective refractive index difference is generated in the active layer 15 by the refractive index difference between the ridge portion 9 and the outside area thereof, so the refractive index type waveguide 4 is formed inside the active layer 15 corresponding to the convex portion 25.

Figure 4:
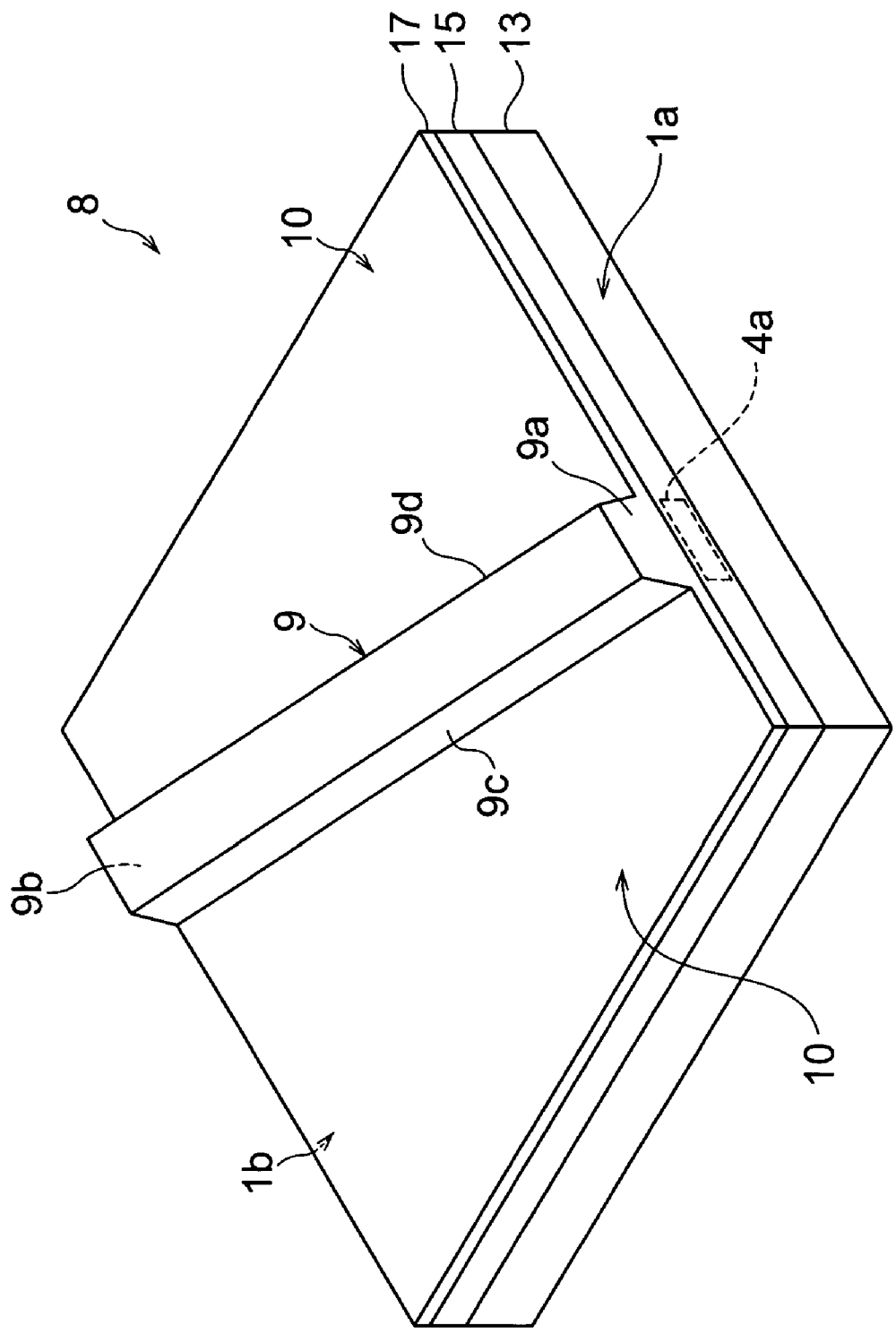
FIG. 4 is a perspective view showing the structure of a laminated body including the p-type cladding layer having a ridge portion.

Next, the structure of the p-type cladding layer 17 will be explained with reference to FIG. 4 and FIG. 5. FIG. 4 is a perspective view showing the structure of the laminated body 8 including the p-type cladding layer 17 which has the ridge portion 9, and FIG. 5 shows the structure of the laminated body 8 shown in FIG. 4. The area (a) of FIG. 5 is a plan view of the laminated body 8, and the area (b) of FIG. 5 is a cross-sectional view showing the II—II cross-section of the laminated body 8 shown the area (a) of FIG. 5. As described above, in the laminated body 8, three semiconductor layers of the n-type cladding layer 13, active layer 15 and p-type cladding layer 17 are sequentially laminated.

On the p-type cladding layer 17, a convex ridge portion 9, which extends from the light emitting face 1a to the light reflecting face 1b, is formed. The area of the p-type cladding layer 17, other than the ridge portion 9 (thin region 10), has a thin layer thickness. The ridge portion 9 is a parallelogram in the two-dimensional shape viewed from the thickness direction, extending along the direction crossing the direction A matching each normal line of the light emitting face 1a and light reflecting face 1b at angle θ.

The ridge portion 9 has a first end face 9a, second end face 9b, and a pair of side faces 9c and 9d facing each other. The pair of side faces 9c and 9d are boundaries of the ridge portion 9 and the thin region 10 respectively. The first end face 9a positions above the light emitting face 1a. The second end face 9b positions above the light reflecting face 1b. The side face 9c extends from one end of the first end face 9a to one end of the second end face 9b, and the side face 9d extends from the other end of the first end face 9a to the other end of the second end face 9b. The side faces 9c and 9d are formed so as to form angle θ with the direction A in the plan view viewed from the thickness direction.

In the active layer 15, the refractive index type waveguide 4 corresponding to the shape of the ridge portion 9 is formed. The refractive index type waveguide 4 is a waveguide formed by an effective refractive index distribution in the active layer 15 generated by injecting current into the ridge portion 9. And, in the refractive index type waveguide 4, the laser beam emitting end 4a is formed corresponding to the first end face 9a of the ridge portion 9, and a pair of side faces (described later) are formed corresponding to each of the side faces 9c and 9d of the ridge portion 9 respectively. The angle θ formed by the side faces 9c and 9d and the direction A at the ridge portion 9 is determined based on the critical complementary angle θc on the side face of the refractive index type waveguide 4. Here, the critical complementary angle θc on the side face of the refractive index type waveguide 4 is a complementary angle of a total reflection critical angle determined by the effective refractive index difference between the inside and outside of the refractive index type waveguide 4. As described later, it is preferable that the angle θ is in the range of θc−1° ≦ θ ≦ θc, and it is more preferable that θ = θc, that is the angle θ roughly matches the critical complementary angle θc. Since angle θ is determined based on the critical complementary angle θc, the pair of side faces of the refractive index type waveguide 4 totally reflect lights which enter along the direction A from the light emitting face 1a side or light reflecting face 1b side.

The distance between the light emitting face 1a and the light reflecting face 1b (that is, the length of the refractive index type waveguide 4) and the space between the pair of side faces 9c and 9d of the ridge portion 9 (width of the ridge portion 9) are set such that the laser beams L which resonate between the laser beam emitting end 4a (light emitting face 1a) and the laser beam reflecting end 4b (light reflecting face 1b) are reflected respectively on the pair of side faces 4c and 4d of the refractive index type waveguide 4 for the same number of times.

Figure 6:
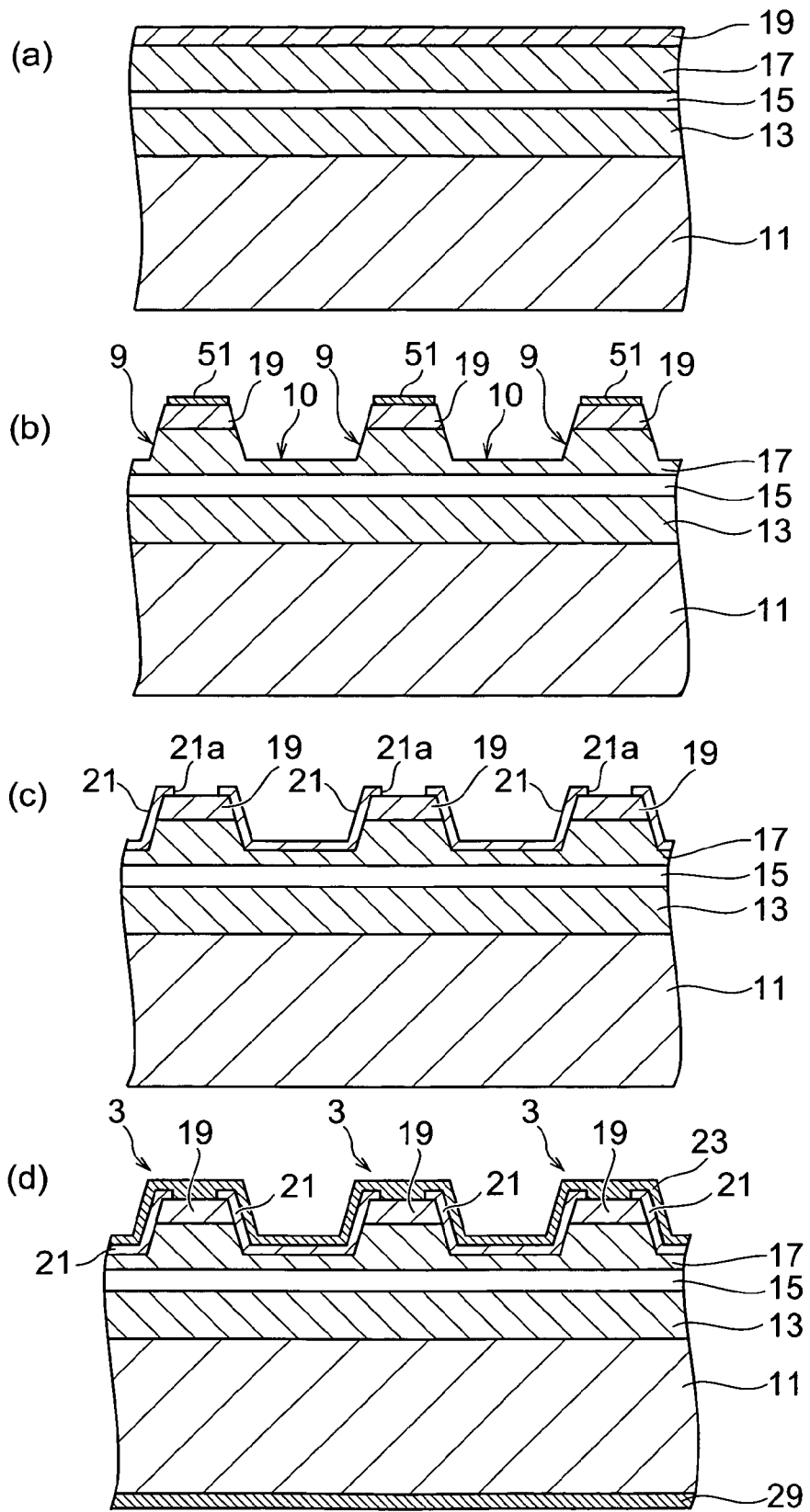
FIG. 6 is an enlarged cross-sectional view explaining the fabrication steps of the semiconductor laser element array shown in FIG. 2.

Next, the fabrication method of the semiconductor laser element array 1 will be explained with reference to FIG. 6. FIG. 6 shows enlarged cross-sectional views of the semiconductor laser element array 1 in each fabrication step. First, the n-type GaAs substrate 11 is prepared. On this substrate 11, an n-type AlGaAs with a 2.0 μm film thickness, GaInAs/AlGaAs with a 0.3 μm film thickness, a p-type AlGaAs with a 2.0 μm film thickness, and a p-type GaAs with a 0.1 μm film thickness are sequentially formed by epitaxial growth, so as to form the n-type cladding layer 13, active layer 15 having a quantum well structure, p-type cladding layer 17, and cap layer 19 (see the area (a) of FIG. 6).

A passivation mask 51 having a shape corresponding to the ridge portion 9 is formed at the cap layer side 19 by photo work, and the cap layer 19 and the p-type cladding layer 17 are etched. The etching is stopped at a depth which does not reach the active layer 15 (see the area (b) of FIG. 6). On the entire crystal surface after this etching ends, an SiN film is deposited. And an insulating layer 21 is formed by removing a part of the SiN film on the ridge portion 9 by photo work (see the area (c) of FIG. 6). Then, a p-side electrode layer 23 is formed by covering the entire crystal surface by a Ti/Pt/Au film. On the other hand, after polishing and chemical processing are performed, an n-side electrode layer 29 made of AuGe/Au film is formed on the element surface at the substrate 11 side (see the area (d) of FIG. 6).

Figure 7:
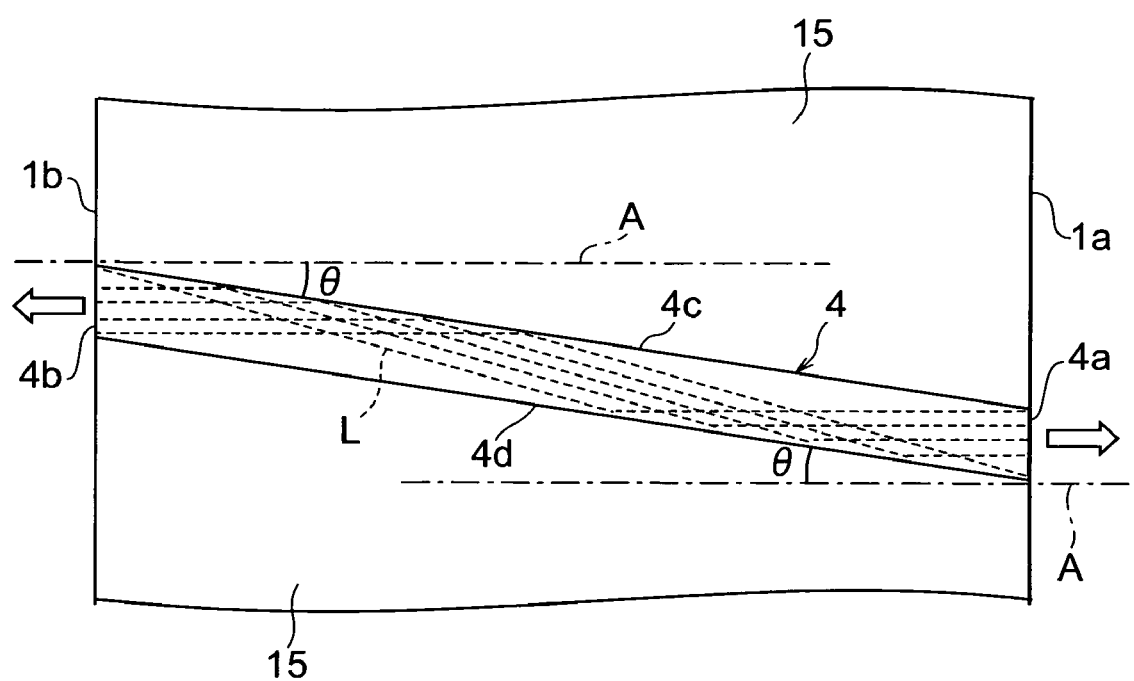
FIG. 7 is a plan view showing the shape of the refractive index type waveguide formed in the active layer corresponding to the ridge portion.

Next, the behavior of laser beams inside the refractive index type waveguide 4 will be explained. FIG. 7 is a plan view showing the shape of the refractive index type waveguide 4 formed in the active layer 15 corresponding to the ridge portion 9. The refractive index type waveguide 4 has a two-dimensional shape the same as the ridge portion 9. The refractive index type waveguide 4 in the thickness direction is determined by the boundary face between the active layer 15 and the p-type cladding layer 17, and the boundary face between the active layer 15 and the n-type cladding layer 13. The refractive index type waveguide 4 has a laser beam emitting end 4a and laser beam reflecting end 4b directly under the first end face 9a and second end face 9b of the ridge portion 9 respectively. The laser beam emitting end 4a and the laser beam reflecting end 4b are a part of the cleavage plane of the active layer 15, and function as the resonating faces of the laser beams L.

The refractive index type waveguide 4 has side faces 4c and 4d corresponding to the side faces 9c and 9d of the ridge portion 9 respectively. The side faces 4c and 4d are faces generated by the refractive index difference between the inside and outside of the refractive index type waveguide 4, and may have a predetermined thickness when the refractive index changes continuously. The side faces 4c and 4d function as a reflecting face which selectively transmits or reflects the laser beams L generated inside the refractive index type waveguide 4 depending on the angle formed by the traveling direction of the laser beams and this side face. The angle θ formed by the side faces 4c and 4d of the refractive index type waveguide 4 and a predetermined axis direction A (that is, an angle formed by the side faces 9c and 9d of the ridge portion 9 and the direction A) is determined based on the critical complementary angle θc on the side faces 4c and 4d of the refractive index type waveguide 4, as mentioned above.

The laser beams L reflected along the direction A in the laser beam reflecting end 4b enters the side face 4c at angle θ, as shown in FIG. 7, and are totally reflected. Then, the laser beams L enter the side face 4d at angle θ, and are totally reflected again. In this way, the laser beams L totally reflected on the side faces 4c and 4d travel along the direction A and reach the laser beam emitting end 4a. A part of the laser beams L which reached the laser beam emitting end 4a are transmitted through the laser beam emitting end 4a and are emitted to the outside. The other laser beams L are reflected by the laser beam emitting end 4a along the direction A, and returns to the laser reflecting end 4b while repeating the total reflection on the side faces 4d and 4c. In this way, the laser beams L in the refractive index type waveguide 4 resonate by reciprocating between the laser beam emitting end 4a and the laser beam reflecting end 4b.

Figure 8:
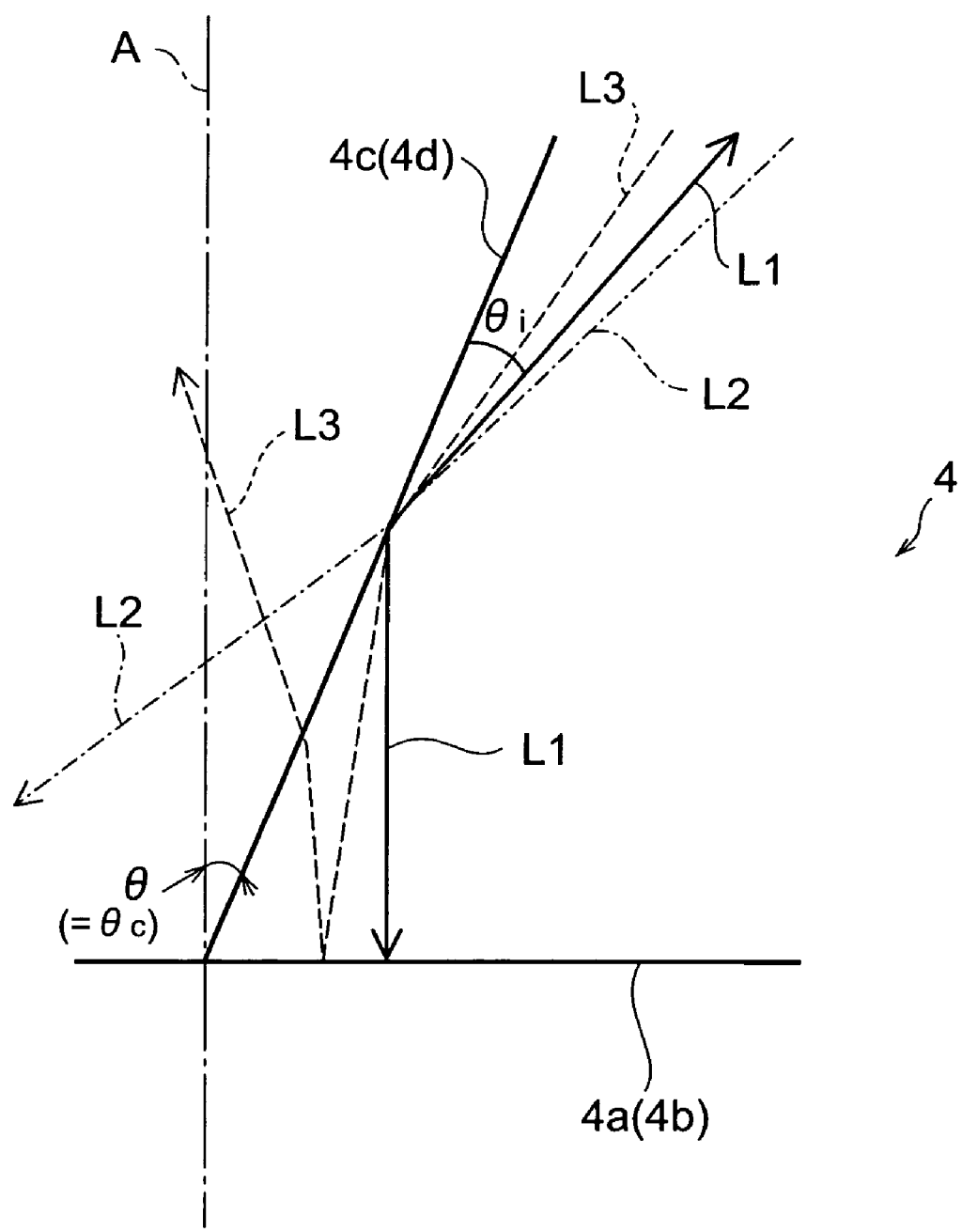
FIG. 8 is a view showing the laser beams which enter the side face of the refractive index type waveguide at various angles θi.

Next, the mechanism of limiting the laser beams L to the above mentioned optical path will be explained. FIG. 8 is a view showing the laser beams L1-L3 which entered the side face 4c (4d) at various angles θi. In FIG. 8, the angles formed by the side faces 4c and 4d and the laser beams L1-L3 are complementary angles of the incident angles of the laser beams L1-L3 to the side faces 4c and 4d, and in the following description, the angle θi is called an "incident complementary angle". To simplify description, the angle θ formed by the side face 4c (4d) and the direction A is matched with the critical complementary angle θc.

In FIG. 8, the laser beams L1 which entered the side face 4c (4d) at the incident complementary angle θi, which is the same as the angle θ, are totally reflected on the side face 4c (4d), then enter vertically into the laser beam emitting end 4a (laser beam reflecting end 4b). And the laser beams L1 are reflected on the laser beam emitting end 4a (laser beam reflecting end 4b), then return via the same optical path. Therefore, the laser beams L1 resonate on the same optical path.

The laser beams L2 which entered the side face 4c (4d) at an incident complementary angle θi, which is larger than angle θ and exceeds the critical complementary angle θc, transmit through the side face 4c (4d), and do not resonate. The laser beams L3 which entered the side face 4c (4d) at the incident complementary angle θi, which is smaller than the angle θ and does not exceed the critical complementary angle θc, are all reflected on the side face 4c (4d), reflected on the laser beam emitting end 4a (laser beam emitting end 4b), then when entering the side face 4c (4d) again, the incident complementary angle exceeds the critical complementary angle θc. Therefore, the laser beams L3 also transmit through the side face 4c (4d), and do not resonate after all.

As described above, the width of the ridge portion 9 and the length of the refractive index type waveguide 4 are set such that the laser beams L are totally reflected respectively on the pair of side faces 4c and 4d for the same number of times. In other words, the refractive index type waveguide 4 is formed such that the laser beams L, which resonate between the laser beam emitting end 4a and the laser beam reflecting end 4b, are reflected on the side faces 4c and 4d of the refractive index type waveguide 4 at least once. Therefore, no optical path exists which directly connects the laser beam emitting end 4a and the laser beam reflecting end 4b by a straight line, and no light components exist which resonate directly reciprocating the laser beam emitting end 4a and the laser beam reflecting end 4b.

As described above, in the semiconductor laser element 3, the resonance optical paths, where the laser beams L generated in the refractive index type waveguide 4 reciprocate, are structurally limited to the optical paths connecting the laser beam emitting end 4a, side face 4d, side face 4c and laser beam reflecting end 4b. Therefore, only the laser beams L which enter the side faces 4c and 4d in a direction roughly parallel with the direction A and resonate on the above optical paths contribute to laser oscillation. As a consequence, laser oscillation, of which spatial horizontal mode is single (special horizontal single mode), is acquired, and the intensity distribution of the laser beams L emitted from the laser beam emitting end 4a polarizes to a direction in parallel with the direction A which matches each normal line of the light emitting end 4a and light reflecting end 4b, and the emission pattern thereof has a single peak. This of waveguide structure could have a wide waveguide width, but the laser radiation angle is in inverse proportion to the waveguide width, so the laser beams having a small emission angle is acquired.

Figure 9:
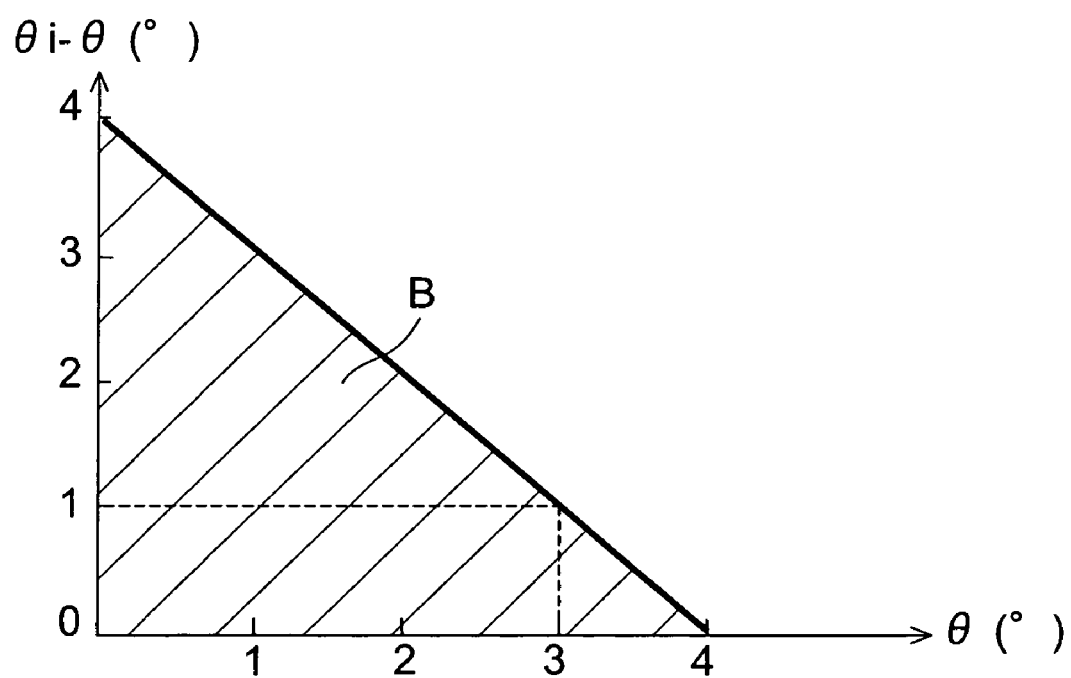
FIG. 9 is a graph explaining the tolerance range of angle θ.

It is preferable that the angle θ formed by the side faces 4a and 4b of the refractive index type waveguide 4 roughly matches the critical complementary angle θc, but the optical paths of the laser beams L can be limited to some extent when the angle θ is close to the critical complementary angle θc in a range smaller than the critical complementary angle θc. Here, FIG. 9 is a graph showing the tolerance range of the angle θ. In FIG. 9, the abscissa is angle θ, and the ordinate is the difference θ−θi between the incident complementary angle θi of the laser beams L to the side face 4c (4d) and the angle θ. In this description, it is assumed that the critical complementary angle θc of the side face 4c and 4d is 4°.

In FIG. 9, a region B enclosed by coordinates (θ,θ−θi)=(0, 0), (4, 0), (0, 4) is shown. This region B indicates the range where the laser beams L can resonate between the laser beam emitting end 4a and the laser beam reflecting end 4b. For example, when the angle θ is 1°, resonation is possible without exceeding the critical complementary angle θc (=4°) on the side faces 4c and 4d when the laser beams L have 0° ≦ θ −θc ≦ 3°, that is the incident complementary angle θi is 1° or more and 4° or less. However, when the angle θ is excessively smaller than the critical complementary angle θc, the number of spatial horizontal modes of the laser beams L in the refractive index type waveguide 4 increases, and the emission angle expands. Therefore, the angle θ is set to 3°≦ θ ≦ 4° (that is θc − 1 ≦ θ≦ θc), for example, then only laser beams L of which incident complementary angle θi is 3° or more and 4° or less are resonated (0°≦θ≦−θi≦1°), and the emission angle of the laser beams L can be decreased to a practical range.

Next, effects unique to the semiconductor laser element 3 having the above structure will be explained. In accordance with the semiconductor laser element 3, optical paths of the laser beams L where resonance occurs are limited. In other words, the incident direction of light components which contribute to laser oscillation is restricted, so higher horizontal mode is suppressed, and the mode becomes close to a single mode. By this, the horizontal emission pattern of the emitted laser beams L have a single peak. Also, unlike the single mode type, the width of the refractive index type waveguide, that is the space between the side face 4c and the side face 4d, is not limited, so laser beam density on the laser beam emission end 4a can be decreased, and laser beams with higher intensity can be emitted. When the width of the refractive index type waveguide 4 is widened, the horizontal emission angle of the laser beams L can be decreased.

In the semiconductor laser element 3, a local and concentrated current is injected into the active layer 15 by the ridge portion 9 which can be easily formed, as shown in the areas (a)-(d) of FIG. 6 so injected current hardly leaks outside the refractive index type waveguide 4. Therefore, in accordance with the semiconductor laser element 3, the emission efficiency and photoelectric conversion efficiency improve. Also, by this structure, a temperature increase of the semiconductor laser element 3 can be effectively suppressed, so reliability of the semiconductor laser element 3 improves, and laser beam intensity can be increased.

Also, as mentioned above, in the laser beams L which are resonated between the laser beam emitting end 4a (light emitting face 1a) and laser beam reflecting end 4b (light reflecting face 1b), the distance between the light emitting face 1a and the light reflecting face 1b (that is, the length of the refractive index type waveguide 4) and the space between the pair of side faces 9c and 9d of the ridge portion 9 (that is, the width of the ridge portion 9) are set such that the laser beams L are reflected respectively on the pair of side faces 4c and 4d of the refractive index type waveguide 4 for the same number of times. By the laser beams L being reflected (total reflection) for the same number of times respectively on the pair of side faces 4c and 4d, resonated laser beams L are appropriately entered/reflected in both the laser beam emitting end 4a and the laser beam reflecting end 4b, along the direction A. By this configuration, the laser beams L are totally reflected on the pair of side faces 4c and 4d at least once respectively, so no optical path exists which connects the laser beam emitting end 4a and the laser beam reflecting end 4b in the refractive index type waveguide 4. Therefore, in accordance with this semiconductor laser element 3, the optical paths of the laser beams L in the refractive index type waveguide 4 are appropriately limited.

In accordance with this semiconductor laser element array 1, which has a plurality of semiconductor elements each of which structure is the same as the semiconductor laser element 3 having the above effect, relatively high intensity laser beam emission becomes possible, and the horizontal emission angle of the laser beams L can be small. Also, in accordance with the semiconductor laser element array 1, emission efficiency and photoelectric conversion efficiency are improved by a simple configuration.

The semiconductor laser element array 1 also has the following effects. In the semiconductor laser element array 1, local and concentrated current is injected into the active layer 15 by the ridge portion 9 of the p-type cladding layer 17. Because of this, the coupling and interface of lights hardly occur between the refractive index type waveguides 4 of the adjacent semiconductor laser elements 3. Therefore, the space between each refractive index type waveguide 4 can be relatively narrow, so more refractive index type waveguides 4 can be formed, and high output laser beams can be stably emitted. Also, local and concentrated current is injected into the active layer 15, so photoelectric conversion efficiency improves and reactive current is decreased, and as a consequence the heat generation of the semiconductor laser element 3 is suppressed. As a result, reliability of the semiconductor laser element array 1 is increased, and longer life is implemented.

First Application Example of First Embodiment

Next, a first application example of the semiconductor laser element 3 according to the first embodiment will be explained. In the first application example, the angle θ formed by the side faces 4c and 4d of the refractive index type waveguide 4 and the direction A, which matches each normal line of the light emitting end 4a and the light reflecting end 4b, is set to the critical complementary angle 4° based on the refractive index difference between the inside and outside the refractive index type waveguide 4. The space between the side face 4c and side face 4d of the refractive index type waveguide 4 (width of the refractive index type waveguide 4) is 40 µm, and the distance between the laser beam emitting end 4a and the laser beam reflecting end 4b (length of the refractive index type waveguide 4) is set to 1200 µm, which can implement the optical path in FIG. 7. The waveguide width of a conventional single mode type semiconductor laser element (including the semiconductor laser element disclosed in Japanese Patent Application Laid-Open No. H10-41582) is about 5 µm at the maximum. This means that the width of the refractive index type waveguide 4 in the semiconductor laser element 3 according to the first embodiment is much wider than that of a conventional single mode type semiconductor laser element.

The area (a) of FIG. 10 is a graph showing the current vs. optical output characteristics of the semiconductor laser element of the first application example. As shown in the graph of the area (a), the current supplied to the semiconductor laser element and the laser beam output has a linear correlation, and kinks are not generated, so in accordance with this semiconductor laser element, stable spatial horizontal single mode is acquired and the slope efficiency is 0.75 W/A. The area (b) of FIG. 10, on the other hand, is a graph showing a horizontal far-field pattern of the laser beams L emitted from the laser beam emitting end 4a of the semiconductor laser element. As shown in the graph of the area (b), in this semiconductor laser element, the intensity distribution of the far-field pattern of the laser beams L is polarized to a predetermined axis direction (0°), and the horizontal emission angle is small. In the graph of the area (b), the half width of the peak is about 2°.

As a comparison example, the characteristics of the resonator disclosed in the International Publication No. 00/48277 Pamphlet are shown in FIG. 11. The area (a) of FIG. 11 is a graph showing the current vs. optical output characteristics of this resonator. As shown in the graph of the area (a), the mode is unstable because of the generation of disturbance (kinks) of the laser beam output characteristics corresponding to the change of the spatial horizontal mode as the laser optical output increases, and the slop efficiency at this time is 0.5 W/A. The area (b) of FIG. 11, on the other hand, is a graph showing a horizontal far-field pattern of the laser beams emitted from this resonator. As shown in the graph of the area (b), the half width of the main peak is about 2°.

In accordance with the semiconductor laser element of the first application example, compared with the resonator disclosed in the International Publication No. 00/48227 Pamphlet, the emission efficiency and photoelectric efficiency can be improved, and stable spatial horizontal single mode operation can be implemented even during high output.

Second Application Example of First Embodiment

Next, as a second application example of the first embodiment, a semiconductor element array 1, having a plurality of semiconductor laser elements each of which have the same structure of the semiconductor laser element 3 of the first embodiment having the above structure, will be explained. In the second application example, 50 ridge portions are formed in 1 cm with a 200 µm pitch. The area (a) of FIG. 12 is a graph showing the current vs. optical output characteristics of the semiconductor laser element array of the second application example. As shown in the graph of the area (a), the current supplied to each semiconductor laser element of the semiconductor laser element array and the laser beam output has a linear correlation, and kinks are not generated. The slope efficiency of the element according to this graph is 0.75 W/A, which is equivalent to the case of a single semiconductor laser element (see FIG. 10). Therefore, as compared with the resonator of the International Publication No. 00/48227 Pamphlet, it is clear that the structure of this semiconductor laser element array having the ridge portion 9 excels.

The area (b) of FIG. 12 is a graph showing the horizontal far-field pattern of the laser beams L emitted from the laser beam emitting end of each semiconductor laser element included in the semiconductor laser element array of the second application example. As shown in the graph of the area (b), in this semiconductor laser element array, the intensity distribution of the far-field pattern of the laser beams is similar to the intensity distribution of a single semiconductor laser element (see the area (b) of FIG. 10). This means that characteristics similar to the case of a single element are maintained even in the arrayed structure.

In accordance with the semiconductor laser element array according to the second application example, injection current to the active layer is concentrated by the ridge structure, so the coupling and interface of laser beams between the arrayed refractive index type waveguide s can be effectively suppressed.

Second Embodiment

Figure 13:
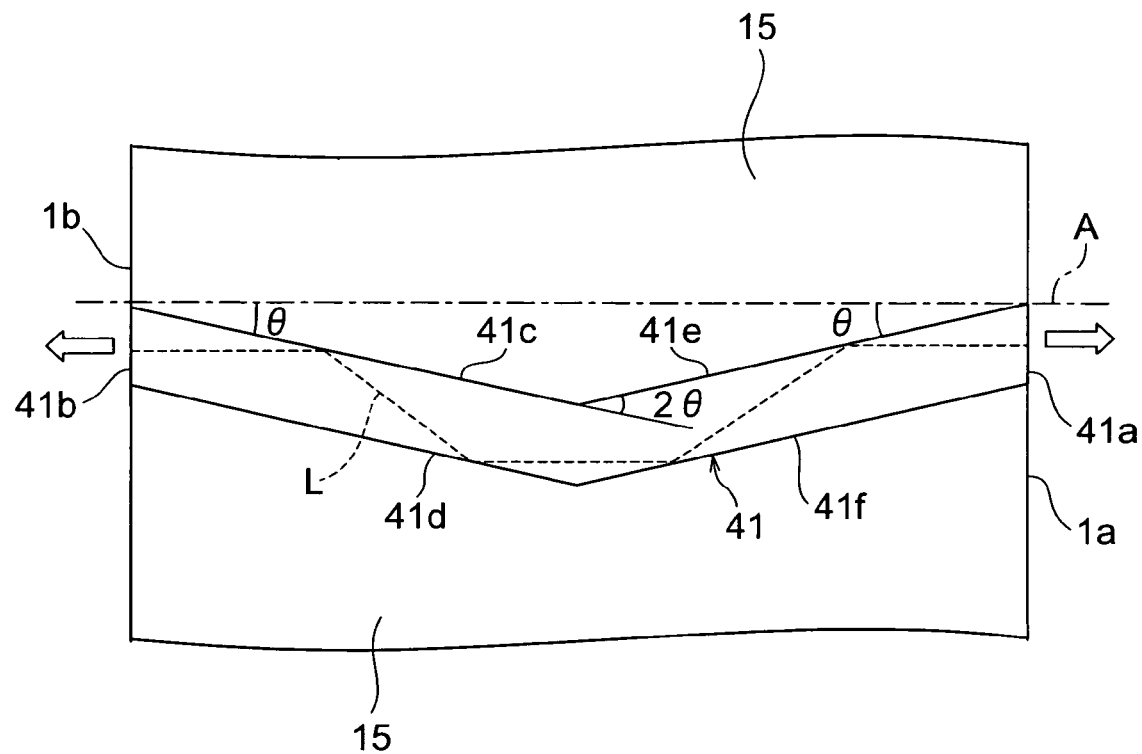
FIG. 13 is a plan view showing the refractive index type waveguide formed in a second embodiment of the semiconductor laser element according to the present invention.

Next, a second embodiment of the semiconductor laser element according to the present invention will be explained. The semiconductor laser element of the second embodiment as well can be applied to the semiconductor laser element array shown in FIG. 2. FIG. 13 is a plan view showing the refractive index type waveguide formed in the second embodiment of the semiconductor laser element according to the present invention. In this refractive index type waveguide 41, the two-dimensional shape is different from the above mentioned refractive index type waveguide 4 of the first embodiment. In other words, the shape of the ridge portion for forming the refractive index type waveguide 41 is different from the shape of the ridge portion 9 of the first embodiment. The refractive index type waveguide 41 has four side faces, 41c-41f. Among these, the side face 41c and side face 41d face each other, and the side face 41e and side face 41f face each other. One end of the side face 41c contacts one end of the laser beam reflecting end 41b, and one end of the side face 41d contacts the other end of the laser beam reflecting end 41b. The other end of the side face 41c is connected to one end of the side face 41e, and the other end of the side face 41d is connected to one end of the side face 41f. The other end of the side face 41e contacts one end of the laser beam emitting end 41a, and the other end of the side face 41f contacts the other end of the laser beam emitting end 41a. The side faces 41c-41f cross with the direction A matching each normal line of the light emitting end 41a and light reflecting end 41b at angle θ respectively. On the other hand, the side face 41c and the side face 41e are connected with each other at angle 2θ, and the side face 41d and side face 41f also are connected with each other at angle 2θ. The second embodiment is implemented by the ridge portion, which has the same two-dimensional shape as the refractive index type waveguide 41 shown in FIG. 13, being formed in the p-type cladding layer.

The laser beams L reflected on the laser beam reflecting end 41b along the direction A are totally reflected on the side face 41c, advance along the direction A again by being totally reflected again on the side face 41d. And, the laser beams L are totally reflected on the side face 41f, and reach the laser beam emitting end 41a along the direction A by being totally reflected again on the side face 41e. A part of the laser beams L which reached the laser beam emitting end 41a are reflected on the laser beam emitting end 41a along the direction A, and the rest reach the laser beam reflecting end 41b by traveling the above optical path in reverse. In this way, the laser beams L resonate between the laser beam emitting end 41a and the laser beam reflecting end 41b.

The semiconductor laser element of the present invention may have a structure forming the refractive index type waveguide 41 having the shape shown in FIG. 13 as the second embodiment (in particular the structure of the ridge portion), instead of the refractive index type waveguide 4 of the first embodiment. By this structure, effects similar to the first embodiment can be implemented. In accordance with the refractive index type waveguide 41 of the second embodiment, the laser beams L are totally reflected on the side faces 41c-41f for a higher number of times than the first embodiment, so the effect to remove light components, other than the laser beams L advancing along the direction A, increases, and the resonance mode of the laser beams L can be even closer to single mode.

Third Embodiment

Figure 14:
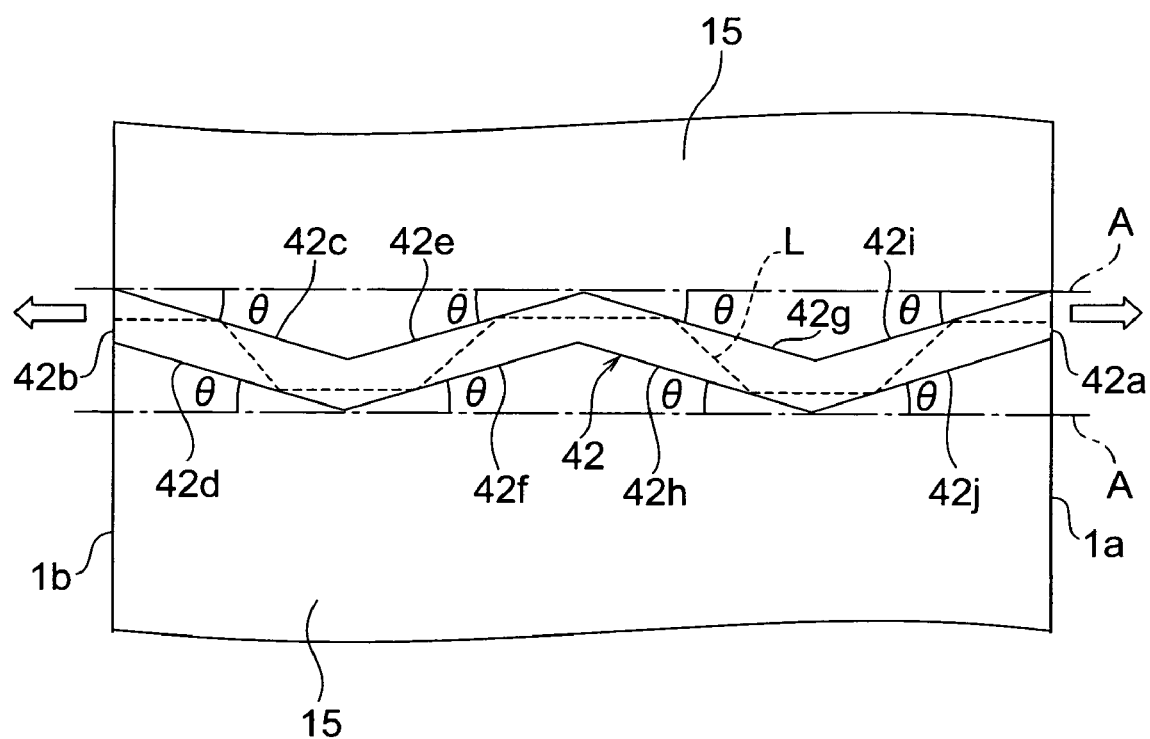
FIG. 14 is a plan view showing the refractive index type waveguide formed in a third embodiment of the semiconductor laser element according to the present invention.

Next, a third embodiment of the semiconductor laser element according to the present invention will be explained. The semiconductor laser element of the third embodiment as well can be applied to the semiconductor laser element array shown in FIG. 2. FIG. 14 is a plan view showing the refractive index type waveguide formed in the third embodiment of the semiconductor laser element according to the present invention. The refractive index type waveguide 42 has 8 side faces, 42c-42j. Among these, the side face 42c and side face 42d face each other, the side face 42e and side face 42f face each other, the side face 42g and side face 42h face each other, and the side face 42l and side face 42j face each other. One end of the side face 42c contacts one end of the laser beam reflecting end 42b, and one end of the side face 42d contacts the other end of the laser beam reflecting end 42b. The other end of the side face 42c is connected to one end of the side face 42e, and the other end of the side face 42d is connected to one end of the side face 42f. The other end of the side face 42e is connected to one end of the side face 42g, and the other end of the side face 42f is connected to one end of the side face 42h. The other end of the side face 42g is connected to one end of the side face 42i, and the other end of the side face 42h is connected to one end of the side face 42j. The other end of the side face 42i contacts one end of the laser beam emitting end 42a, and the other end of the side face 42j contacts the other end of the laser beam emitting end 42a. Each of the side faces 42c-42i cross with the direction A matching each normal line of the light emitting end 42a and the light reflecting end 42b at angle θ respectively. The side face 42c and the side face 42e are connected at the angle 2θ, and the side face 42d and the side face 42f are connected with each other at the angle 2θ. The side face 42e and the side face 42g are connected with each other at the angle 2θ, and the side face 42f and the side face 42h are connected with each other at the angle 2θ. The side face 42g and the side face 42i are connected with each other at the angle 2θ. and the side face 42h and the side face 42j are connected with each other at the angle 2θ. The third embodiment is implemented by forming a ridge portion, which has a same two-dimensional shape as the refractive index type waveguide 42 shown in FIG. 14, being formed in the p-type cladding layer.

The laser beams L reflected on the laser beam reflecting end 42b along the direction A are totally reflected sequentially on the side faces 42c, 42d, 42f, 42e, 42g, 42h, 42j and 42i, reaching the laser beam emitting end 42a along the direction A. A part of the laser beams L which reached the laser beam emitting end 42a are reflected on the laser beam emitting end 42a, and reach the laser beam reflecting end 42b by traveling the above optical path in reverse. In this way, the laser beams L resonate between the laser beam emitting end 42a and the laser beam reflecting end 42b.

The semiconductor laser element of the present invention may have a structure forming the refractive index type waveguide 42 having the shape shown in FIG. 14 as the third embodiment (particularly the structure of the ridge portion). By this, an effect similar to the first embodiment can be acquired.

Fourth Embodiment

Figure 15:
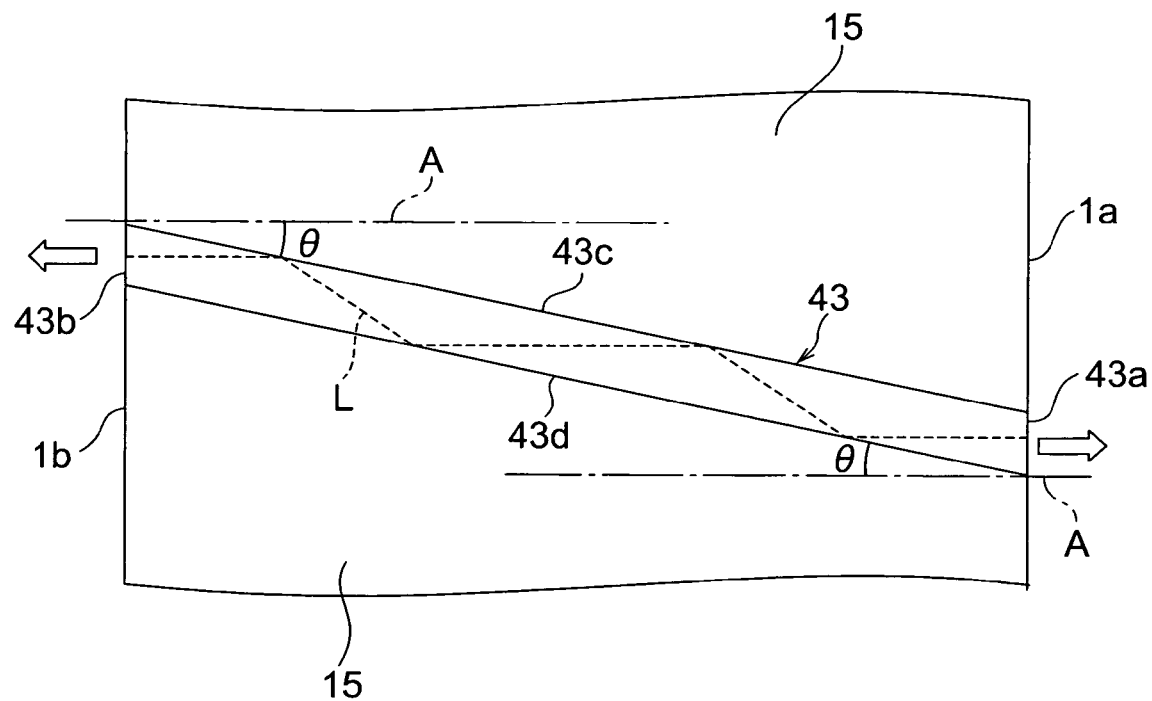
FIG. 15 is a plan view showing the refractive index type waveguide formed in a fourth embodiment of the semiconductor laser element according to the present invention.

Next, a fourth embodiment of the semiconductor laser element according to the present invention will be explained. The semiconductor laser element of the fourth embodiment as well can be applied to the semiconductor laser element array shown in FIG. 2. FIG. 15 is a plan view showing the refractive index type waveguide formed in the fourth embodiment of the semiconductor laser element according to the present invention. In the fourth embodiment, the shape of the refractive index type waveguide 43 is the same as the refractive index type waveguide 4 of the first embodiment, except for the following point. In the fourth embodiment, the space between the side face 43c and the side face 43d (width of the refractive index type waveguide 43) and the distance (length of the refractive index type waveguide 43) between the laser beam emitting end 43a (light emitting face 1a) and the laser beam reflecting end 43b (light reflecting face 1b) are set so that the laser beams L reflected on the laser beam reflecting end 43b along the direction A matching the normal line of the light reflecting end 43b totally reflected twice respectively on the side faces 43c and 43d.

The laser beams L reflected on the laser beam reflecting end 43b along the direction A are totally reflected on the side face 43c, and advances along the direction A again by being totally reflected again on the side face 43d. And, the laser beams L reach the laser beam emitting end 43a along the direction A by being totally reflected again on the side face 43c and by being totally reflected on the side face 43d. A part of the laser beams L are reflected on the laser beam emitting end 43a along the direction A, and the rest reach the laser beam reflecting end 43b by traveling the above optical path in reverse. In this way, the laser beams L resonate between the laser beam emitting end 43a and the laser beam reflecting end 43b.

The semiconductor laser element of the present invention may have a structure forming the refractive index type waveguide 43 having the shape shown in FIG. 15 as the fourth embodiment (particularly the structure of the ridge portion). By this structure, effects similar to the first embodiment can be implemented. The number of times of totally reflecting laser beams on the side faces of the refractive index type waveguide may be an arbitrary count, instead of the first embodiment (once on each side face) and the fourth embodiment (twice on each side face). In order to increase the number of times of reflection on the side faces of the refractive index type waveguide as the fourth embodiment, the length of the refractive index type waveguide is increased. By setting the length of the refractive index type waveguide long, thermal radiation from the semiconductor laser element can be more active, and high output and long life can be implemented.

Fifth Embodiment

Figure 16:
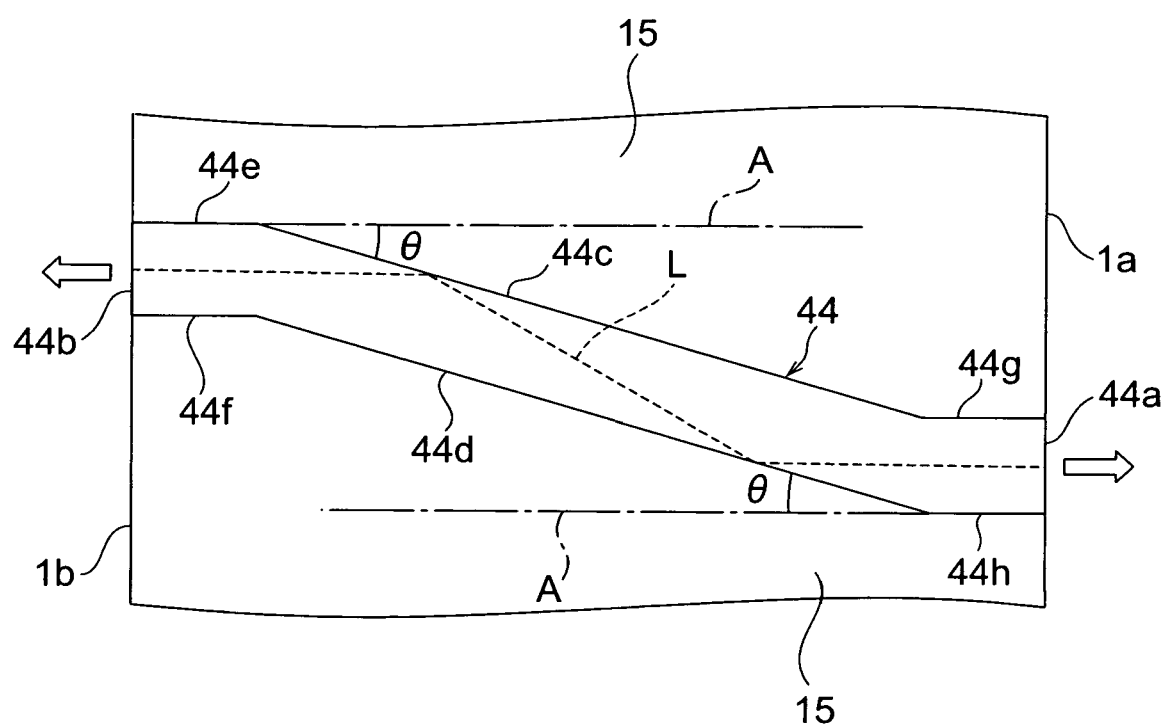
FIG. 16 is a plan view showing the refractive index type waveguide formed in a fifth embodiment of the semiconductor laser element according to the present invention.

Next, a fifth embodiment of the semiconductor laser element according to the present invention will be explained. The semiconductor laser element of the fifth embodiment as well can be applied to the semiconductor laser element array shown in FIG. 2. FIG. 16 is a plan view showing the refractive index type waveguide formed in the fifth embodiment of the semiconductor laser element according to the present invention. The two-dimensional shape of the refractive index type waveguide 44 of the fifth embodiment is the same as the refractive index type waveguide 4 of the first embodiment, except for the following point. In the refractive index type waveguide 44 formed in the fifth embodiment, the side faces 44g and 44h at the edge of the laser beam emitting end 44a side (light emitting face 1a side), and the side faces 44c and 44d at the edge of the laser beam reflecting end 44b side (light reflecting face 1b) are formed along the direction A matching each normal line of the light emitting end 44a and the light reflecting end 44b.

In particular, the refractive index type waveguide 44 has 6 side faces, 44c-44h. Of these, the side face 44c and the side face 44d face each other, the side face 44e and the side face 44f face each other, and the side face 44g and the side face 44h face each other. One end of the side face 44e contacts one end of the laser beam reflecting end 44b and one end of the side face 44f contacts the other end of the laser beam reflecting end 44b. The other end of the side face 44e is connected with one end of the side face 44c, and the other end of the side face 44f is connected with one end of the side face 44d. The other end of the side face 44c is connected to one end of the side face 44g, and the other end of the side face 44d is connected to one end of the side face 44h. The other end of the side face 44g contacts one end of the laser beam emitting end 44a, and the other end of the side face 44h contacts the other end of the laser beam emitting end 44a. Each of the side faces 44c and 44d cross with the direction A at the angle $\theta$. The side faces 44e-44h extend along the direction A respectively. The side face 44e and the side face 44c are connected with each other at the angle $\theta$, and the side face 44f and the side face 44d are connected with each other at the angle $\theta$. The side face 44c and the side face 44g are connected with each other at the angle $\theta$, and the side face 44d and the side face 44h are connected with each other at the angle $\theta$. The fifth embodiment is implemented by forming the ridge portion, which has the same two-dimensional shape as the refractive index type waveguide 44 shown in FIG. 16, being formed on the p-type cladding layer.

The laser beams L reflected on the laser beam reflecting end 44 along the direction A are totally reflected on the side face 44c, and reach the laser beam emitting end 44a along the direction A by being totally reflected again on the side face 44d. A part of the laser beams L are reflected on the laser beam emitting end 44a along the direction A, and reach the laser beam reflecting end 44b by traveling the above optical path in reverse. In this way, the laser beams L resonate between the laser beam emitting end 44a and the laser beam reflecting end 44b.

The semiconductor laser element of the present invention may have a structure forming the refractive index type waveguide 44 having the shape shown in FIG. 16 as the fifth embodiment (particularly the structure of the ridge portion). By this structure, effects similar to the first embodiment can be implemented. In the refractive index type waveguide 44 according to the fifth embodiment, the side faces 44e-44h, which position at both edges, are formed along the direction A, so laser beams emitted in directions different from the direction A (side mode lights) on the laser beam emitting end 44a and the laser beam reflecting end 44b can be decreased. Therefore, in accordance with the fifth embodiment, the emission angle of the laser beams L can be further decreased. The side face along a direction matching each normal line of the light emitting end 44a and the light reflecting end 44b may be formed only at one edge of the refractive index type waveguide 44, that is only the edge of the laser beam emitting end 44a side (light emitting face 1a side), or the edge of the laser beam reflecting end 44b side (light reflecting face 1b side) of the refractive index type waveguide.

Sixth Embodiment

Figure 17:
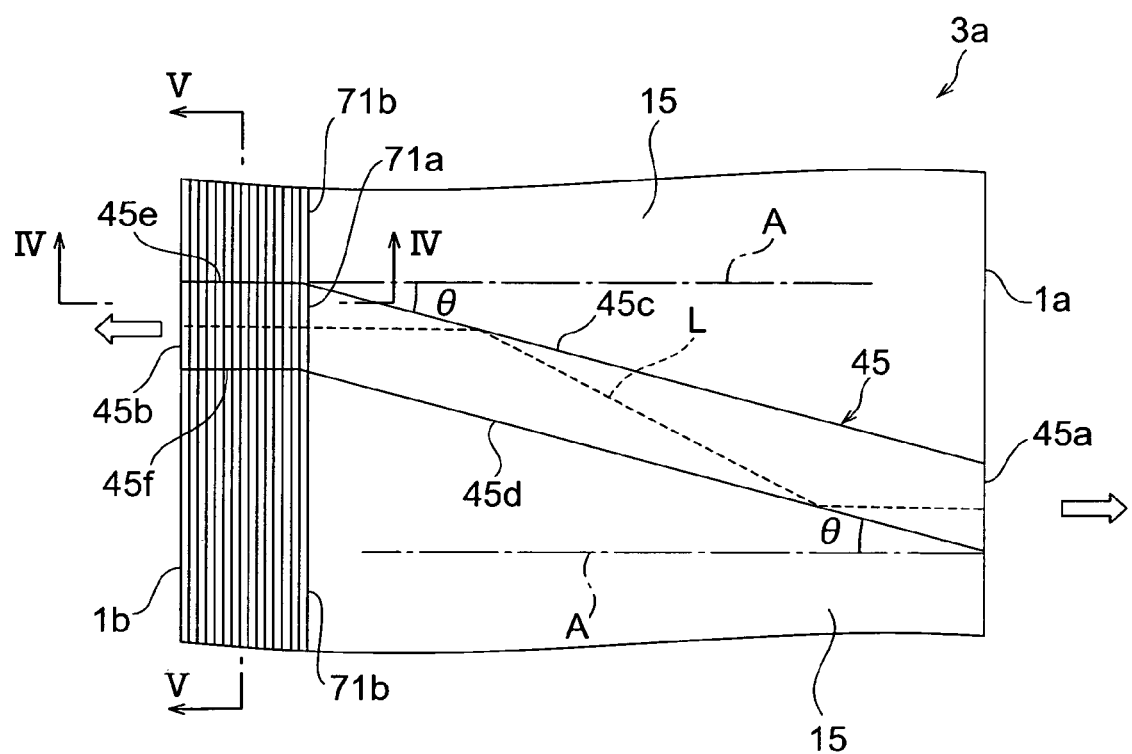
FIG. 17 is a plan view showing configuration around the refractive index type waveguide formed in the active layer as a sixth embodiment of the semiconductor laser device according to the present invention.

Next, a sixth embodiment of the semiconductor laser element according to the present invention will be explained. The semiconductor laser array to which the semiconductor laser element 3a of the sixth embodiment is applied has the same structure as the semiconductor laser array 1 shown in FIG. 2. FIG. 17 is a plan view showing the configuration around the refractive index type waveguide 45 formed in the active layer in the semiconductor laser element 3a according to the sixth embodiment. The two-dimensional shape of the refractive index type waveguide 45 of the sixth embodiment is the same as the refractive index type waveguide 4 of the first embodiment, except for the following point. In the refractive index type waveguide 45, the side faces 45e and 45f at the edge of the laser beam reflecting end 45b side (that is the light reflecting face 1b side) are formed along the direction A, which matches each normal line of the laser beam emitting end 45a and the laser beam reflecting end 45b.

Specifically, the refractive index type waveguide 45 has 4 side faces, 45c-45f. Of these, the side face 45c and the side face 45d face each other and the side face 45e and the side face 45f face each other. One end of the side face 45e contacts one end of the laser beam reflecting end 45b, and one end of the side face 45f contacts the other end of the laser beam reflecting end 45b. The other end of the side face 45e is connected with one end of the side face 45c, and the other end of the side face 45f is connected with one end of the side face 45d. The other end of the side face 45c contacts one end of the laser beam emitting end 45a, and the other end of the side face 45d contacts the other end of the laser beam emitting end 45a. The side faces 45c and 45d cross with the direction A at angle $\theta$ respectively. The side faces 45e and 45f extend along the direction A respectively. The side face 45e and the side face 45c are connected with each other at the angle θ, and the side face 45f and the side face 45d are connected with each other at the angle θ. In the sixth embodiment, the refractive index type waveguide 45 having this shape can be formed in the active layer by forming a ridge portion having the same two-dimensional shape in the p-type cladding layer. Of the refractive index type waveguide 45, the length determined by the side faces 45c and 45d is 1200 μm, for example, and the length determined by the side faces 45e and 45f is 30 μm, for example. The width of the refractive index type waveguide 45 (space between side faces) is 30 μm, for example.

The laser beams L reflected on the laser beam reflecting end 45b along the direction A are totally reflected on the side face 45c. And the laser beams L reach the laser beam emitting end 45a along the direction A by being totally reflected again on the side face 45d. A part of the laser beams L are reflected on the laser beam emitting end 45a along the direction A, and reach the laser beam reflecting end 45b by traveling the above optical path in reverse. In this way, the laser beams L resonate between the laser beam emitting end 45a and the laser beam reflecting end 45b.

The semiconductor laser element 3a of the sixth embodiment also has periodic diffraction gratings 71a and 71b. The diffraction gratings 71a and 71b function as wavelength selection means for selecting a wavelength of the laser beams L which resonate inside the waveguide 45, and are formed along at least a part of the refractive index type waveguide 45 (the portion determined by the side faces 45e and 45f in the case of the sixth embodiment).

Figure 18:
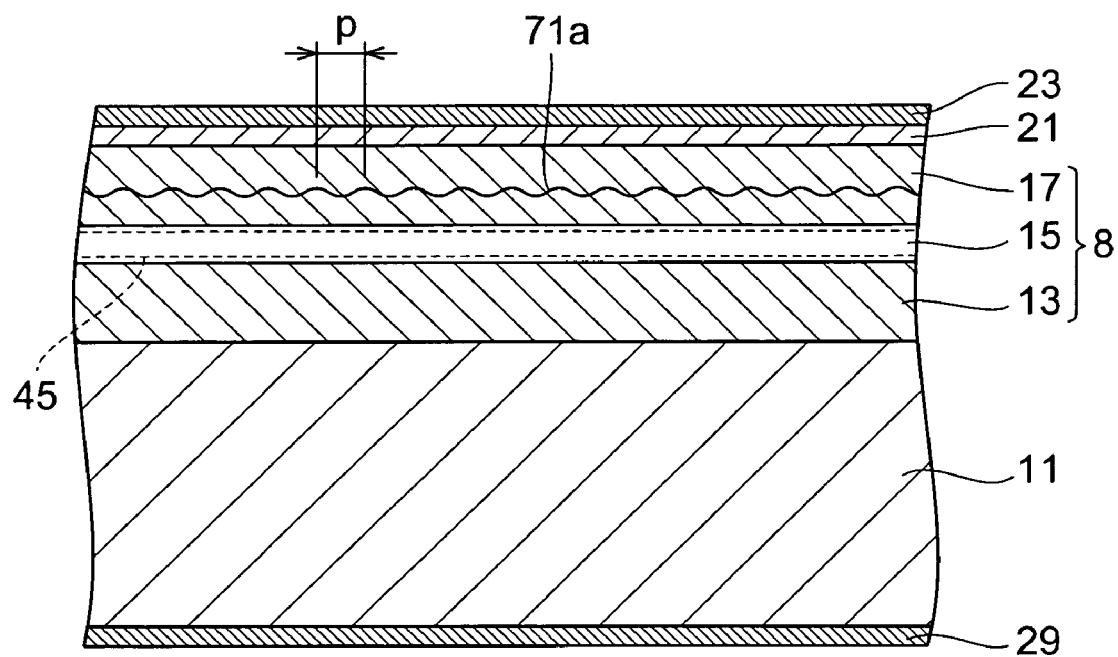
FIG. 18 is a diagram showing the cross-sectional structure (a part of IV—IV cross-section) of the semiconductor laser element according to the sixth embodiment shown in FIG. 17.

FIG. 18 is a view showing the cross-sectional structure (a part of the IV-IV cross section) of the semiconductor laser element 3a according to the sixth embodiment shown in FIG. 17. As shown in FIG. 18, the diffraction grating 71a is formed inside the p-type cladding layer 17 along the refractive index type waveguide 45. The pitch p of the diffraction grating 71a is determined by p=M×λ/2n, where M is the mode degree, n is the refractive index of the refractive index type waveguide 45, and λ is the oscillation wavelength. For example, when the oscillation wavelength λ=940 nm and refractive index n=3.4, then pitch is p=138 nm in the first degree mode, and p=276 nm in the second degree mode.

FIG. 19 explaining diagrams showing an example of steps of forming the above diffraction grating 71a. As shown in the area (a) of FIG. 19, an n-type cladding layer 13, an active layer 15 and a part of a p-type cladding layer 17a are sequentially laminated on the substrate 11, then a resist film 73 having periodic openings 73a is formed. For the method of forming the openings 73a of the resist film 73, a flux interference exposure method using the interference fringe of laser beams by a Mach-Zehnder interference system, or an electron beam direct writing method for forming the openings 73a by contacting the electron beam to the resist film 73, for example, can be used. By etching the p-type cladding layer 17a through the resist film 73, the diffraction grating 71a is formed on the surface of the p-type cladding layer 17a, as shown in the area (b) of FIG. 19. Then, as shown in the area (c) of FIG. 19, the rest of the p-type cladding layer 17b is laminated on the p-type cladding layer 17a. In this way, the diffraction grating 71a is formed inside the p-type cladding layer 17. In the above example, the diffraction grating 71a is formed inside the p-type cladding layer 17, but the diffraction grating may be formed on the boundary face between the active layer 15 and the p-type cladding layer 17. When the semiconductor laser element has a structure having an optical guide layer between the p-type cladding layer and the active layer, the diffraction grating may be formed on the boundary face of the optical guide layer and the p-type cladding layer, the boundary face of the active layer and the optical guide layer, or inside the optical guide layer.

FIG. 20 shows the cross-sectional structure (a part of the V—V cross-section and a part of the VI—VI cross-section) of the semiconductor laser element according to the sixth embodiment shown in FIG. 17. The area (a) of FIG. 20 shows the V—V cross-section of the semiconductor laser element 3a of the sixth embodiment shown in FIG. 17, and the area (b) of FIG. 20 shows the cross-sectional structure of the semiconductor laser element 3a along the VI—VI line shown in the area (a) of FIG. 20. In the areas (a) and (b) of FIG. 20, the insulation layer 21 and the p-side electrode layer 23 are omitted. As shown in the areas (a) and (b) of FIG. 20, the diffraction grating 71b is formed on the surface of the thin region 10 of the p-type cladding layer 17 along the side faces 45e and 45f of the refractive index type waveguide 45. An example of a method of forming the diffraction grating 71b is forming the thin region 10 by etching the p-type cladding layer 17 (see the area (b) of FIG. 6), then etching the surface of the thin region 10 through the resist film having periodic openings. The diffraction grating 71b is formed with a patch p, which is the same as the pitch p of the diffraction grating 71a.

As the semiconductor laser element 3a of the sixth embodiment shows, it is preferable that the semiconductor laser element further has the wavelength selection means (diffraction gratings 71a and 72b) for selecting the wavelength of the laser beams L which resonate inside the refractive index type waveguide 45. The critical complementary angle θc on the side faces 45c and 45d of the refractive index type waveguide 45 depend on the wavelength of the laser beams L reflected on the side faces 45c and 45d. In accordance with the semiconductor laser element 3a of the sixth embodiment, the wavelength of the laser beams L which resonate in the refractive index type waveguide 45 is selected by the diffraction gratings 71a and 71b, so dispersion of the critical complementary angle θc, on the side faces 45c and 45d of the refractive index type waveguide 45, can be decreased, and the optical paths of the laser beams L can be efficiently limited.

The semiconductor laser element 3a of the sixth embodiment has an effect similar to the above mentioned first embodiment. In the refractive index type waveguide 45, the side faces 45e and 45f at one edge of the refractive index type waveguide 45 are formed along the direction A, so the components of the laser beams L, which are emitted to directions different from the direction A (side mode light components), can be effectively decreased.

FIG. 21 is a plan view showing the configuration around the refractive index type waveguide formed inside the active layer as a variant form of the semiconductor laser element 3a according to the sixth embodiment shown in FIG. 17. The area (a) of FIG. 21 shows a variant form where only a diffraction grating 71a is formed as the wavelength selection means along at least a part of the refractive index type waveguide 45. The area (b) of FIG. 21 shows a variant form where only a diffraction grating 71b is formed as the wavelength selection means along at least a part of the waveguide 45. As these variant forms show, the diffraction grating 71a or 71b may be formed by itself, where the wavelength of the laser beams L, which resonate inside the refractive index type waveguide 45, can be appropriately selected.

Seventh Embodiment

Figure 22:
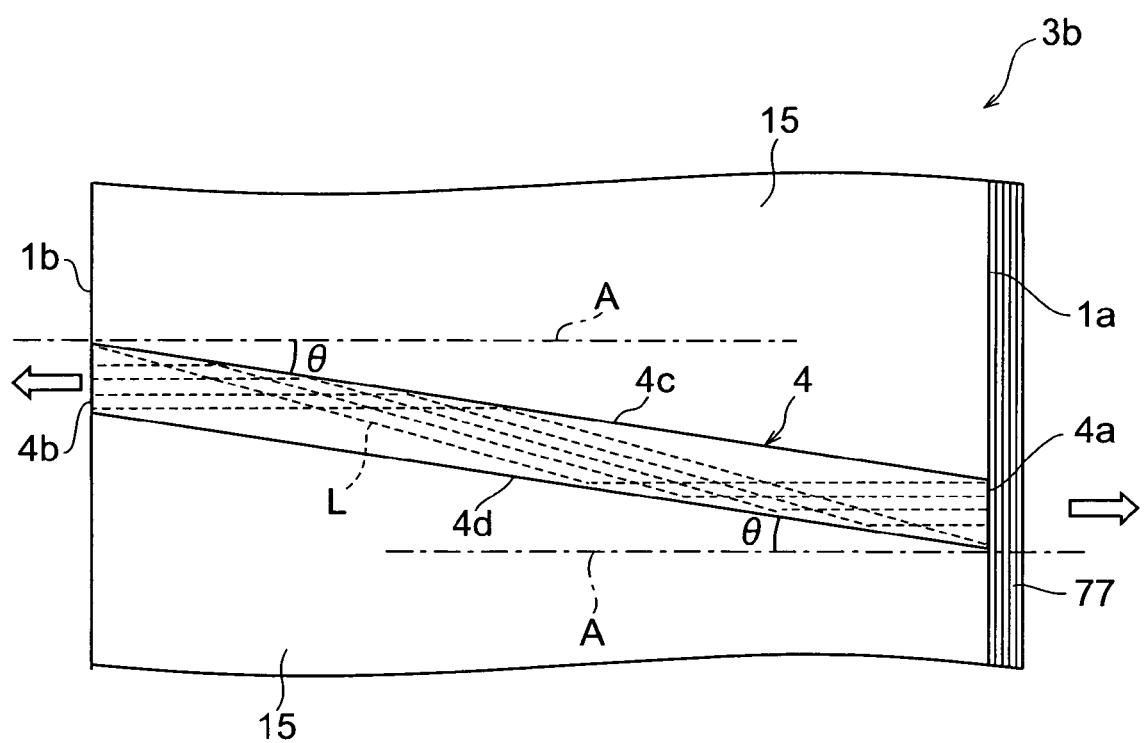
FIG. 22 is a plan view showing the configuration around the refractive index type waveguide formed in the active layer as a seventh embodiment of the semiconductor laser device according to the present invention.

Next, a seventh embodiment of the semiconductor laser element according to the present invention will be explained. The semiconductor laser array to which the semiconductor laser element 3b of the seventh embodiment is applied also has the same structure as the semiconductor array 1 shown in FIG. 2. FIG. 22 is a plan view showing the configuration around the refractive index type waveguide 4 formed in the active layer in the semiconductor laser element 3b according to the seventh embodiment. The difference between the semiconductor laser element 3b of the seventh embodiment and the semiconductor laser element 3 of the first embodiment is the presence of a dielectric multilayer film 77. The dielectric multilayer film 77 functions as the wavelength selection means for selecting the wavelength of the laser beams L, which resonate inside the refractive index type waveguide 4.

The dielectric multilayer film 77 is formed on the light emitting face 1a of the semiconductor laser element 3b. The dielectric multilayer film 77 may be formed on the light reflecting face 1b, or may be formed on both the light emitting face 1a and the light reflecting face 1b. The dielectric multilayer film 77 is made of a dielectric material, such as $SiO_2$, $TiO_2$, $\alpha$-Si, $Al_2O_3$ or $Ta_2O_3$. The dielectric multilayer film 77 (k) in the seventh embodiment has a structure in which $SiO_2$/ $TiO_2$, for example, are alternately laminated. The dielectric multilayer film 77 is formed on the light emitting face 1a by sputtering or electron beam deposition, for example. The layer thickness t of each layer of the dielectric multilayer film 77 is set to be $t=\lambda/4n$, where n is a refractive index of each material, and $\lambda$ is the selected wavelength.

In the seventh embodiment, the wavelength of the laser beams L, which resonate inside the refractive index type waveguide 4, is selected by the dielectric multilayer film 77 of the semiconductor laser element 3b, so the dispersion of the critical complementary angle θc on the side faces 4c and 4d of the refractive index type waveguide 4 can be decreased, and the optical paths of the laser beams L can be efficiently limited.

Eighth Embodiment

Figure 23:
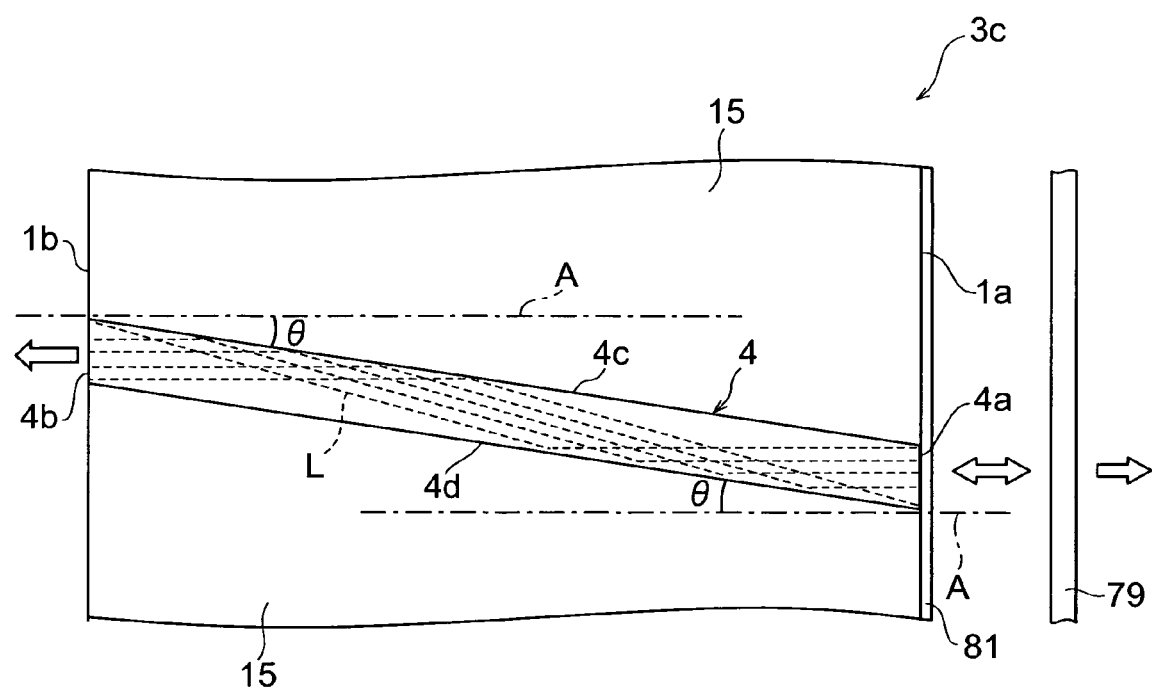
FIG. 23 is a plan view showing the configuration near the refractive index type waveguide formed in the active layer as an eighth embodiment of the semiconductor laser element according to the present invention.

Next, an eighth embodiment of the semiconductor laser element according to the present invention will be explained. The semiconductor laser array to which the semiconductor laser element 3c of the eighth embodiment is applied has the same structure as the semiconductor laser array 1 shown in FIG. 2. FIG. 23 is a plan view showing the configuration around the refractive index type waveguide 4 formed in the active layer in the semiconductor laser element 3c. The difference between the semiconductor laser element 3c of the eighth embodiment and the semiconductor laser element 3 of the first embodiment is the presence of a wavelength selecting element 79. The wavelength selecting element 79 functions as the wavelength selection means for selecting the wavelength of the laser beams L which resonate inside the refractive index type waveguide 4.

For the wavelength selecting element 79, an etalon or a partial reflection mirror (e.g. 30% reflectance) can be appropriately used. The wavelength selecting element 79 is formed at a position facing the light emitting face 1a of the semiconductor laser element 3c. The wavelength selecting element 79 may be fixed to the semiconductor laser element 3c, or may be fixed as a part of the optical system in a state of being distant from the semiconductor laser element 3c. The wavelength selecting element may be formed at a position facing the light reflecting face 1b or a position facing the light emitting face 1a and a position facing the light reflecting face 1b respectively. It is preferable that an anti-reflection film (AR coating) 81 is formed on the face of the semiconductor laser element 3c facing the wavelength selecting element 79 (on the light emitting face 1a in the case of the eighth embodiment).

In the eighth embodiment, the wavelength of the laser beams L, which resonate inside the refractive index type waveguide 4, is selected by the wavelength selecting element 79 of the semiconductor laser element 3c, so the dispersion of the critical complementary angle θc on the side faces 4c and 4d of the refractive index type waveguide 4 can be effectively decreased, and the optical paths of the laser beams L can be efficiently limited. For the wavelength selecting element, the above mentioned etalon and partial reflection mirror and various elements having similar functions can be used.

For the wavelength selection means, two or more of the diffraction gratings 71a and 71b in the sixth embodiment, dielectric multilayer film 77 in the seventh embodiment, and wavelength selecting element 79 in the eighth embodiment may be combined. Also, for the wavelength selection means, various other means having similar functions can be applied.

The semiconductor laser element of the present invention and the semiconductor laser element array to which the semiconductor laser element is applied are not limited to the above mentioned embodiments, application examples and variant forms, but various modifications are possible. For example, in each of the above embodiments, a GaAs semiconductor laser element was used as an example, but the configuration of the present invention can also be applied to semiconductor laser elements made of other materials, such as GaN and InP.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

INDUSTRIAL APPLICABILITY

The semiconductor laser element according to the present invention can be applied to various light emitting devices which can efficiently emit relatively high intensity laser beams at a small emission angle with a simplifier configuration.

The invention claimed is:
1. A semiconductor laser element, comprising:
a first cladding layer with a first conductive type;
a second cladding layer with a second conductive type different from the first conductive type, provided on said first cladding layer;
an active layer provided between said first and second cladding layers;
a light emitting face which corresponds to one end face of said active layer; and
a light reflecting face which corresponds to the other end face opposing one end face of said active layer and is arranged such that a first normal line passing through the center thereof is substantially in parallel with a second normal line passing through the center of said light emitting face,
wherein said second cladding layer has a ridge portion for forming a refractive index type waveguide of which both end faces correspond to said light emitting face and said light reflecting face respectively, in said active layer, a part of said ridge portion, excluding at least both edges thereof, extending in a direction crossing the first and second normal lines at an angle equal to or less than the complementary angle θc of the total reflection critical angle on the side face of said refractive index type waveguide respectively.

2. A semiconductor laser element according to claim 1, wherein said light emitting face and said light reflecting face are arranged in a state where the first normal line and second normal line match.

3. A semiconductor laser element according to claim 1, wherein said light emitting face and said lighting reflecting face are arranged in a state where the first normal line and second normal line are apart from each other in a predetermined distance.

4. A semiconductor laser element according to claim 1, wherein the distance between said light emitting face and said light reflecting face, and the maximum width of said ridge portion along the direction perpendicular to the first and second normal lines are set such that light components which resonate in said refractive index type waveguide between said light emitting face and said light reflecting face are reflected for a same number of times respectively on a pair of side faces facing each other of said refractive index type waveguide.

5. A semiconductor laser element according to claim 1, wherein at least one of the edge of said light emitting face side and the edge of said light reflecting face side of said ridge portion extends along the first and second normal lines respectively.

6. A semiconductor laser element according to claim 1, wherein an angle $\theta$ formed by each of the first and second normal lines and a direction in which said ridge portion, excluding both edges, extends is within the following range: $\theta c - 1° \leq \theta \leq \theta c$.

7. A semiconductor laser element according to claim 1, wherein the angle $\theta$ formed by each of the first and second normal lines and the direction in which the part of said ridge portion, excluding both edges thereof, extends substantially matches with the complementary angle $\theta c$ of the total reflection critical angle.

8. A semiconductor laser element according to claim 1, further comprising wavelength selection means for selecting a wavelength of light components which resonate in said refractive index type waveguide.

9. A semiconductor laser element according to claim 8, wherein said wavelength selection means includes a periodic diffraction grating provided along at least a part of said refractive index type waveguide.

10. A semiconductor laser element according to claim 8, wherein said wavelength selection means includes a dielectric multilayer film provided on at least one face of said light emitting face and said light reflecting face.

11. A semiconductor laser element according to claim 8, wherein said wavelength selection means includes a wavelength selecting element provided so as to face at least one face of said light emitting face and said light reflecting face.

12. A semiconductor laser element array, comprising a plurality of semiconductor laser elements each having the same structure as a semiconductor laser element according to claim 1, wherein said plurality of semiconductor laser elements are arranged along the direction perpendicular to the first and second normal lines.

* * * * *